(12) United States Patent
Sakurada

(10) Patent No.: US 7,459,176 B2
(45) Date of Patent: Dec. 2, 2008

(54) APPARATUS AND METHOD FOR FABRICATING FUNCTIONAL FILM

(75) Inventor: Kazuaki Sakurada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1099 days.

(21) Appl. No.: 10/796,276

(22) Filed: Mar. 10, 2004

(65) Prior Publication Data

US 2004/0239853 A1  Dec. 2, 2004

(30) Foreign Application Priority Data

Mar. 13, 2003 (JP) ............................ 2003-068331
Feb. 17, 2004 (JP) ............................ 2004-040068

(51) Int. Cl.
*B05D 5/12* (2006.01)
(52) U.S. Cl. .................... 427/58; 427/164; 427/256; 427/266; 349/106; 118/323
(58) Field of Classification Search ................. 427/58, 427/164, 266, 256; 349/106; 118/323
See application file for complete search history.

(56) References Cited

U.S. PATENT DOCUMENTS

| 6,280,559 B1 * | 8/2001 | Terada et al. ............ 156/295 |
| 6,645,029 B2 | 11/2003 | Akahira |
| 6,660,332 B2 | 12/2003 | Kawase et al. |
| 6,783,208 B2 | 8/2004 | Kawase et al. |
| 7,226,642 B2 * | 6/2007 | Sakurada .................. 427/421.1 |
| 2003/0001992 A1 | 1/2003 | Kawase et al. |
| 2003/0223030 A1 | 12/2003 | Byun et al. |
| 2005/0248715 A1 | 11/2005 | Byun et al. |

FOREIGN PATENT DOCUMENTS

| JP | 09-329707 A | 12/1997 |
| JP | 10-264375 | 6/1998 |
| JP | 2002-189120 A | 7/2002 |
| JP | 2002-196124 A | 7/2002 |
| JP | 2002-221616 A | 8/2002 |
| JP | 2002-221617 A | 8/2002 |
| JP | 2002-225259 A | 8/2002 |
| JP | 2002-250811 A | 9/2002 |
| KR | 2003-74051 | 9/2003 |
| TW | 519577 B | 2/2003 |

* cited by examiner

*Primary Examiner*—Shamim Ahmed
(74) *Attorney, Agent, or Firm*—Global IP Counselors, LLP

(57) ABSTRACT

A functional film fabrication method for fabricating a functional film on a base having a flat surface includes an installation step and an application step. In the installation step, a base is installed so that the flat surface is on top, and a droplet discharge head with a plurality of nozzles aligned in a first direction is arranged above the flat surface. In the application step, a functional film is fabricated on the flat surface by repeating a discharge step and a nozzle movement step. In the discharge step, droplets of a functional liquid are discharged from the nozzles onto the base. In the nozzle movement step, the nozzles are moved relative to the base in a second direction perpendicular to the first direction over a distance shorter than the distance between the nozzles in the first direction.

13 Claims, 29 Drawing Sheets

APPARATUS AND METHOD FOR FABRICATING FUNCTIONAL FILM

BACKGROUND OF THE INVENTION

1. Field of the Invention

The present invention relates to a method for manufacturing an electro-optical panel for fabricating a protective material film for a color filter by droplet discharge, and a method for manufacturing an electronic device, as well as an electro-optical panel, an electro-optical apparatus, and an electronic apparatus.

2. Background Information

Liquid crystal panels and other electro-optical panels capable of displaying color have a substrate with a color filter to extract selectively light with a specific wavelength from the white light of a light source. Color filters are generally formed from a resin colored with R (red), G (green), and B (blue) pigments. A color filter protective film is then formed on the color filter for the purpose of protecting the color filter and smoothing the surface of the color filter.

Conventionally, color filter protective films are made by thin film fabrication methods typified by spin coating, but such methods have been wasteful in that 90 percent or greater of the color filter protective film is discarded. Also, since a color filter protective film material in liquid form is formed into a thin film by centrifugal force in spin coating, the color filter protective film material adheres to the back surface of the color filter substrate, and a step for washing the back surface of the color filter substrate has been required. This has been a cause of decreased productivity. Furthermore, since a color filter protective film material in liquid form is formed into a thin film by centrifugal force in spin coating, it has been difficult to adapt this technique to a color filter substrate with large dimensions.

In view of this, techniques have recently been proposed for applying color filter protective film materials by inkjet (droplet discharge) methods, as disclosed, for example, in Patent Literature 1 and 2.

Inkjet methods waste hardly any material because the color filter protective film material is discharged from a nozzle to the necessary location. Also, there is no need to wash the back surface of the color filter substrate because the color filter protective film material is accurately discharged to a specific position on the color filter substrate. Furthermore, it is possible to adapt this technique to a color filter substrate with large dimensions if the scanning range of the inkjet head is increased (see JP-A 9-329707 and 2002-189120).

However, inkjets discharge droplets from a tiny nozzle. Droplets can be applied at high density in the main scanning direction (the direction perpendicular to the direction of nozzle alignment) if the drive frequency of discharge is increased. However, since there is a limit to increasing the density of the nozzles, there is also a limit to applying droplets at high density in the direction of nozzle alignment (the auxiliary scanning direction). Accordingly, there are also methods in which droplets are applied at a high density by reducing the width of coating in the auxiliary scanning direction, but productivity decreases as a result.

It will be clear to those skilled in the art from the disclosure of the present invention that an improved method and apparatus for fabricating a functional film is necessary because of the above-mentioned considerations. The present invention meets the requirements of these conventional technologies as well as other requirements, which will be apparent to those skilled in the art from the disclosure hereinbelow.

SUMMARY OF THE INVENTION

An object of the present invention is to provide a method and apparatus for fabricating a functional film whereby the speed of fabricating a functional film can be increased when fabricating a functional film by droplet discharge.

A functional film fabrication method relating to the present invention is a method for fabricating a functional film on a base with a flat surface. This method includes an installation step, a first discharge step, a nozzle movement step, and a second discharge step. In the installation step, the base is mounted so that the flat surface is on top, and a droplet discharge head with a plurality of nozzles aligned in a first direction is placed above the base. In the first discharge step, droplets of a functional liquid are discharged from the nozzles onto the base. In the nozzle movement step, the nozzles are moved relative to the base in the first direction and in a perpendicular second direction over the short distance between the nozzles in the first direction. In the second discharge step, droplets of the functional liquid are discharged from the nozzles onto the base.

In the present invention, the interval between the droplets in the direction of nozzle alignment (first direction) is greater than the interval between the droplets in the second direction. Thus, the width over which the fluid can be applied in a single application is expanded and the speed of functional liquid application is increased. The speed of functional film fabrication can thereby be improved. As for the application density, in the present invention, the intervals between droplets in the second direction are smaller than the intervals between droplets in the first direction; therefore, the desired application density can be ensured.

Another functional film fabrication method relating to the present invention is a method for fabricating a functional film on a base with a flat surface. This method includes an installation step and an application step. In the installation step, the base is mounted so that the flat surface is on top, and a droplet discharge head with a plurality of nozzles aligned in a first direction is placed above the flat surface. In the application step, a discharge step and a nozzle movement step are repeated to form a functional film on the flat surface. In the discharge step, droplets of a functional liquid are discharged from the nozzles onto the base. In the nozzle movement step, the nozzles are moved relative to the base in the first direction and in a perpendicular second direction over a distance shorter than the distance between the nozzles in the first direction.

The functional film fabrication apparatus relating to the present invention is an apparatus for fabricating a functional film on a base with a flat surface. This apparatus includes a stage, a droplet discharge head, a movement mechanism, and a control part. The stage holds the base so that the flat surface is on top. The droplet discharge head has a plurality of nozzles aligned in a first direction, and discharges droplets of a functional liquid from the nozzles onto the base. The movement mechanism is connected to the stage and/or the droplet discharge head in order to move the droplet discharge head above the stage in a second direction perpendicular to the first direction. The control part causes the movement mechanism to move the nozzles relative to the stage in the second direction over a distance shorter than the distance between the nozzles in the first direction.

The control part may control the thickness of the functional film by varying the amount of droplets discharged from the discharge head and/or the distance that the droplet discharge means moves in the second direction relative to the holding means.

The objectives, characteristics, merits, and other attributes of the present invention described above shall be clear to those skilled in the art from the description of the invention hereinbelow. The description of the invention and the accompanying drawings disclose the preferred embodiments of the present invention.

BRIEF DESCRIPTION OF THE DRAWINGS

Referring to the accompanying diagrams, which partially drawings the present invention:

FIG. 3-1 is an explanatory diagram showing a method for manufacturing an electro-optical panel and electronic device relating to the present invention;

FIG. 3-2 is an explanatory diagram showing the method for manufacturing the electro-optical panel and electronic device relating to the present invention;

FIG. 3-3 is an explanatory diagram showing the method for manufacturing the electro-optical panel and electronic device relating to the present invention;

FIG. 3-4 is an explanatory diagram showing the method for manufacturing the electro-optical panel and electronic device relating to the present invention;

FIG. 3-5 is an explanatory diagram showing the method for manufacturing the electro-optical panel and electronic device relating to the present invention;

FIG. 3-6 is an explanatory diagram showing the method for manufacturing the electro-optical panel and electronic device relating to the present invention;

FIG. 3-7 is an explanatory diagram showing the method for manufacturing the electro-optical panel and electronic device relating to the present invention;

FIG. 4 is a flow chart showing the method for manufacturing the electro-optical panel and electronic device relating to the present invention;

FIG. 5-1 is an explanatory diagram showing the droplet discharge device relating to the present invention;

FIG. 5-2 is an explanatory diagram showing a droplet discharge device relating to the present invention;

FIG. 5-3 is an explanatory diagram showing the droplet discharge device relating to the present invention;

FIG. 5-4 is an explanatory diagram showing the droplet discharge device relating to the present invention;

FIG. 5-5 is an explanatory diagram showing the droplet discharge device relating to the present invention;

FIG. 6-1 is a plan view showing a state in which protective film material has been applied;

FIG. 6-2 is a plan view showing the state in which the protective film material has been applied;

FIG. 7-1 is an explanatory diagram showing the application pattern of the protective film material;

FIG. 7-2 is an explanatory diagram showing the application pattern of the protective film material;

FIG. 10-1 is an explanatory diagram showing a droplet discharge device relating to Embodiment 3;

FIG. 10-2 is an explanatory diagram showing the droplet discharge device relating to Embodiment 3;

FIG. 10-3 is an explanatory diagram showing the droplet discharge device relating to Embodiment 3;

FIG. 12-1 is a schematic cross-sectional view of the color filter 600 of the present embodiment shown in the sequence of the manufacturing steps;

FIG. 12-2 is a schematic cross-sectional view of a color filter 600 of the present embodiment shown in the sequence of the manufacturing steps;

FIG. 12-3 is a schematic cross-sectional view of the color filter 600 of the present embodiment shown in a sequence of manufacturing steps;

FIG. 12-4 is a schematic cross-sectional view of the color filter 600 of the present embodiment shown in the sequence of the manufacturing steps;

FIG. 12-5 is a schematic cross-sectional view of the color filter 600 of the present embodiment shown in the sequence of the manufacturing steps;

FIG. 28-1 is a plan view showing the configuration of a first element electrode, a second element electrode, and a conductive film; and FIG. 28-2 is a plan view showing the process of forming a first element electrode, a second element electrode, and a conductive film.

DESCRIPTION OF THE PREFERRED EMBODIMENTS

Embodiments of the present invention will now be described with reference to the drawings. As will be apparent from the disclosure of the present invention to those skilled in the art, the description of the invention embodiments is intended solely to illustrate the present invention and should not be construed as limiting the scope of the present invention, which is defined by the claims described below or by equivalent claims thereof.

The preferred embodiments of the present invention will now be described with reference to the drawings.

Examples of an electro-optical panel relating to the present invention include, for example, a liquid crystal display panel, a DMD (digital micromirror device) display panel, and an organic EL (electroluminescence) display panel. In Embodiments 1 through 3, a protective film material for a color filter is used as the functional liquid, and an example of forming a color filter protective film as a functional film is described. In Embodiment 4, another example of forming a functional film is described.

Embodiment 1

Figure 1:
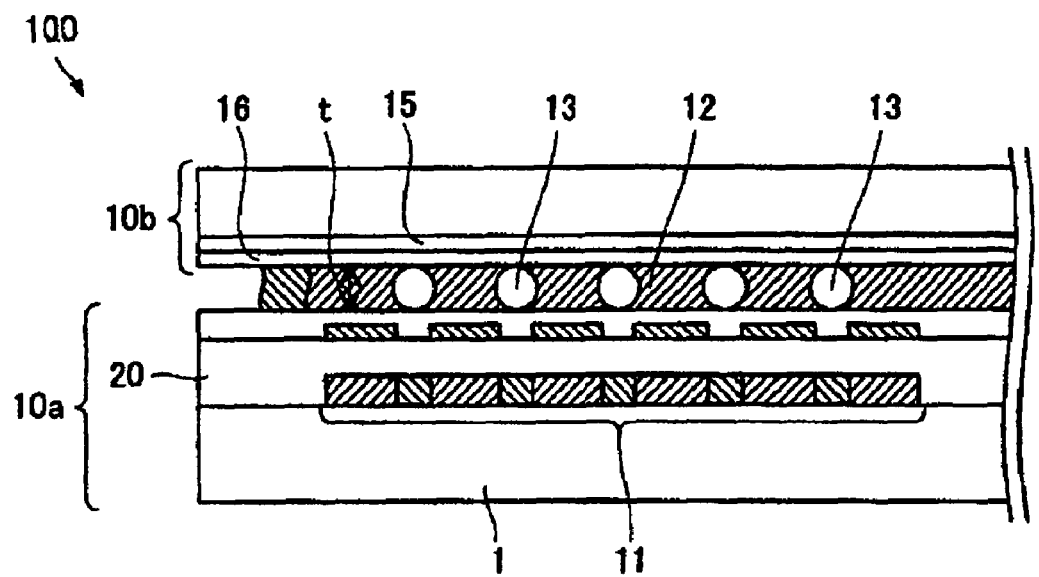
FIG. 1 is a partial cross-sectional view showing a structure of the electro-optical panel relating to the present invention.

FIG. 1 is a partial cross-sectional view showing the structure of an electro-optical panel relating to the present invention. The electro-optical panel 100 is such that a protective film material whose viscosity and surface tension are adjusted to a specific range is applied by a droplet discharge system onto a color filter substrate on which a color filter is formed, thus fabricating a color filter protective film.

The electro-optical panel 100 has of a liquid crystal 12 sealed between a color filter substrate 10a wherein a color filter 11 is formed on the surface of a substrate 1, and an opposing substrate 10b disposed opposite thereto. Spacers 13 are disposed between the color filter substrate 10a and the opposing substrate 10b, and the interval t between the substrates is virtually constant over the entire surface.

Figure 2:
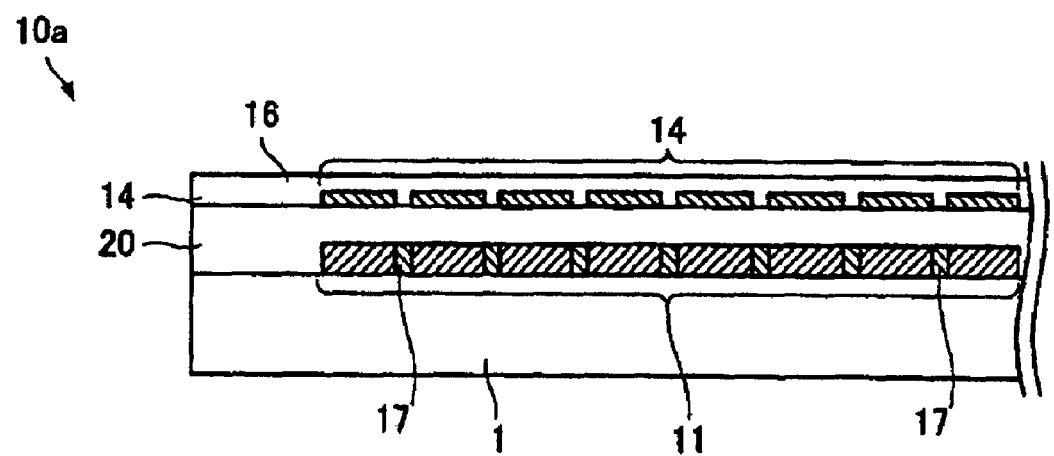
FIG. 2 is a partial cross-sectional view showing a color filter substrate relating to the present invention.

FIG. 2 is a partial cross-sectional view showing the color filter substrate relating to the present invention. The color filter 11 is formed on the side of the color filter substrate 10a that faces the opposing substrate 10b. A block matrix 17 is formed within the color filter 11. A color filter protective film 20 (hereinafter "CF protective film") is formed on the color filter 11 by the protective film material relating to the present invention. Thus, the color filter 11 formed on the substrate 1 is protected.

Also, an ITO (indium tin oxide) electrode 14 and an orientation film 16 are formed on the CF protective film 20. The CF protective film 20 has a function for protecting the color filter 11 from high temperatures when the ITO electrode 14 is formed, and a function for leveling the irregularities within the color filter 11 and for suppressing burnouts in the ITO electrode 14 and rubbing defects in the orientation film 16.

A plurality of electrodes 15 is formed in a stripe configuration on the inner surface of the opposing substrate 10b to be perpendicular to the electrodes next to the color filter 11, and the orientation film 16 is formed on these electrodes 15. The color filter 11 is disposed at a position that intersects the ITO electrode 14 and the electrodes 15 on the respective substrates. An electrode 39 is also formed from ITO or another such transparent conductive material. A method for manufacturing an electro-optical panel by forming a CF protective film, and an electronic device by manufacturing the electro-optical panel will now be described.

Figures 1, 3:
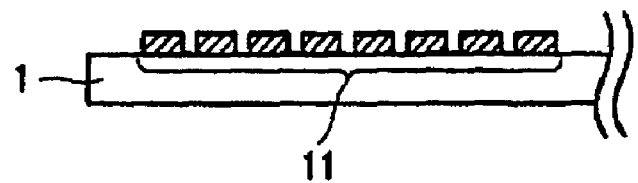
Figures 2, 3:
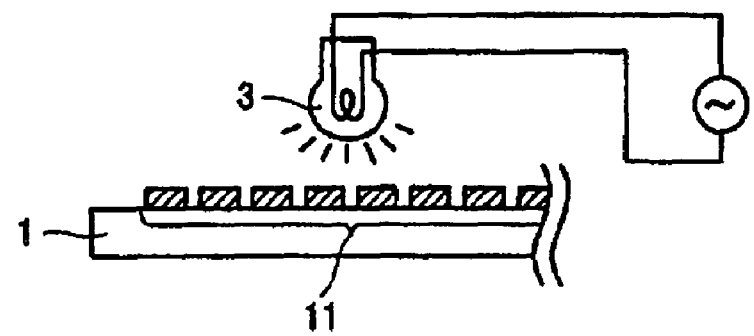
Figure 3:
Figures 3, 4:
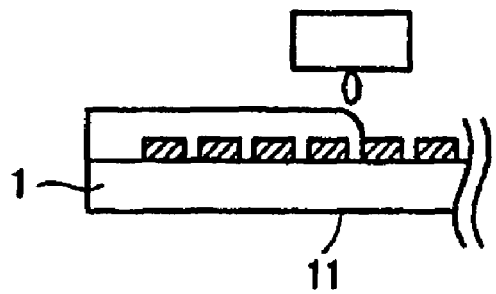
Figures 3, 4, 5:
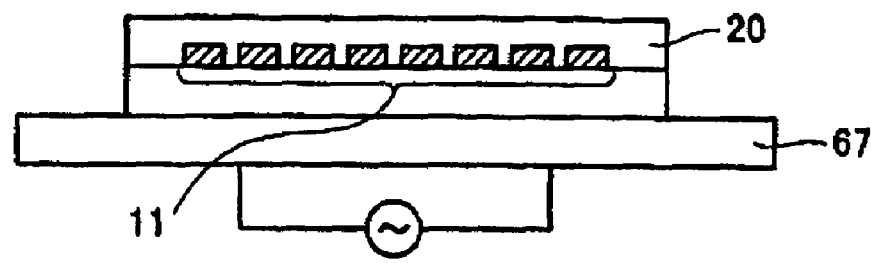

FIGS. 3-1 through 3-7 are explanatory diagrams showing the method for manufacturing the electro-optical panel and an electronic device relating to the present invention. FIG. 4 is a flowchart showing the method for manufacturing the electro-optical panel and an electronic device relating to the present invention. FIGS. 5-1 through 5-5 are explanatory diagrams showing the droplet discharge device relating to the present invention. First, the color filter 11 is formed on the substrate 1 as shown in FIG. 3-1 by photolithography or by droplet discharge with an inkjet, plunger, or the like (step S101).

Next, to improve the wettability of the color filter 11 and the protective film material in liquid form applied thereon, the color filter 11 is subjected to a surface modification treatment (step S102) as shown in FIG. 3-2, thus improving the wettability of the protective film material. The reason is that if the wettability is poor, the protective film material tends to form into droplets, and hence fails to be uniformly applied to the color filter 11. Another reason is the danger that the protective film material may not easily penetrate within the color filter 11, foam may be produced in this portion, and the display image quality of the electro-optical panel may be reduced. The surface modification treatment is performed in the present embodiment by emitting ultraviolet light from a UV lamp 3, but oxygen plasma treatment can also be performed. Oxygen plasma treatment is particularly preferable in the sense that the quality of the CF protective film 20 is increased because the residue on the color filter 11 can be removed.

The wettability of the color filter 11 and the protective film material in liquid form applied thereon can be determined by the angle of contact $\beta$ of the protective film material with the color filter 11 (see FIG. 3-3). In the method for manufacturing the electro-optical panel relating to the present invention, the angle of contact $\beta$ is preferably 10 degrees or less. In this range, the protective film material can sufficiently penetrate within the color filter 11, and the protective film material can be formed on the color filter 11 with a uniform thickness, so a CF protective film 20 of high quality can be formed.

When the surface modification treatment is complete, the protective film material in liquid form is applied to the color filter 11 by droplet discharge as shown in FIG. 3-4 (step S103). The application of the protective film material will now be described using FIG. 5. Ink jetting is used as the droplet discharge in the present invention. A droplet discharge device 50 has a droplet discharge head 52 and a stage 60. The protective film material in liquid form is fed to the droplet discharge head 52 from a tank 56 via a supply tube 58.

The droplet discharge head 52 is a piezojet type and is made of a plurality of nozzles 54 arranged within an alignment width H at a constant pitch P, as shown in FIG. 5-2. Also, each nozzle 54 has a piezoelement, and droplets of the protective film material are discharged from the nozzles 54 according to a command from a control device 65. The amount in which the protective film material is discharged from the nozzles 54 can also be varied by changing the drive pulse supplied to the piezoelement. A personal computer or workstation may be used as the control device 65.

The droplet discharge head 52 is also capable of rotating around a rotation axis A as the center of rotation, wherein the rotation axis A is perpendicular to the center of the head, as shown in FIG. 5-1. When the droplet discharge head 52 is rotated around the rotation axis A and an angle $\theta$ is assigned between the alignment direction of the nozzles 54 and the X direction, the apparent pitch of the nozzles 54 can be denoted by $P'=P \times \sin \theta$, as shown in FIGS. 5-4 and 5-5. Thus, the pitch of the nozzles 54 can be varied according to the coated area of the color filter substrate 10a, the type of protective film material, and other such coating conditions. The color filter substrate 10a is mounted on the stage 60. The stage 60 can move in the Y direction (auxiliary scanning direction) and rotate around a rotation axis B as the center of rotation, wherein the rotation axis B is perpendicular to the center of the stage 60.

The droplet discharge head 52 moves back and forth in the X direction in FIG. 5-1 (main scanning direction) while droplets of the protective film material are discharged on the color filter substrate 10a within the alignment width H of the nozzles 54. Once the protective film material has been applied in a single scan, the stage 60 moves in the Y direction over a distance equal to the alignment width H of the nozzles 54, and the droplet discharge head 52 discharges the protective film material on the next area. The operation of the droplet discharge head 52, the discharge of the nozzles 54, and the operation of the stage 60 are controlled by the control device 65. It is simple to vary the application pattern according to the coated area of the color filter substrate 10a, the type of protective film material, and other such coating conditions if these operating patterns are programmed in advance.

All areas of the color filter substrate 10a can be coated with the protective film material by repeating the above-mentioned operation. Similarly, when the stage 60 moves in the Y direction, it is possible to move the droplet discharge head 52 in the X direction over the alignment width H and to discharge the protective film material on the next area.

Figures 3, 4, 5, 6:
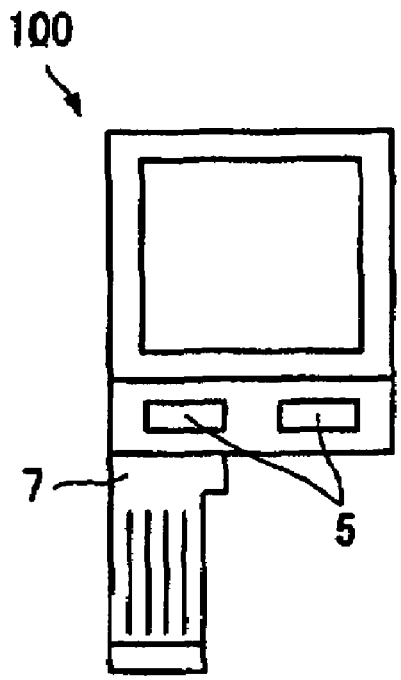

FIGS. 6-1 and 6-2 are plan views showing a state wherein the protective film material has been applied. Droplets of the protective film material are applied to the color filter substrate 10a in intervals of 10 μm in the main scanning direction (X direction) and 140 μm in the auxiliary scanning direction (Y direction). The interval y between the droplets in the auxiliary scanning direction is the same as the pitch P of the nozzles 54 (140 μm in Embodiment 1). The interval x between the droplets in the main scanning direction depends on the scanning rate and discharge frequency of the droplet discharge head 52.

The mass m of a single drop of the protective film material is 20 ng in Embodiment 1, and a CF protective film 20 with a film thickness s of 1 μm can be formed at the above-mentioned droplet interval after the solvent of the protective film material is volatilized. If the same protective film material is used, the film thickness of the CF protective film 20 can be controlled according to the mass of one drop of the protective film material and the droplet intervals x and y in the main and auxiliary scanning directions on the color filter substrate 10a. Specifically, the film thickness s of the CF protective film 20 can be determined with the values m, x, and y as parameters. In the present invention, it is possible to control all of these parameters, so the film thickness s can be controlled by adjusting at least one of these parameters.

When the mass m of one drop of the protective film material is 20 ng, the protective film material on the color filter substrate 10a expands to a circular shape with a diameter of about 200 μm. Therefore, all the adjacent droplets of the protective film material join together into a whole in the case of the above-mentioned values x and y. The droplets of the protective film material fail to join together when x and y both exceed d×√2/2, where d is the diameter of the protective film material on the color filter substrate 10a, as shown in FIG. 6-2. Therefore, the droplet intervals of the protective film material on the color filter substrate 10a must be kept within a range wherein x and y both do not exceed d×√2/2. Specifically, four droplets disposed next to each other to form a square shape on the color filter substrate 10a must all be in overlapping locations.

In this case, the interval y between the droplets in the auxiliary scanning direction depends on the pitch P of the nozzles 54, so the alignment width H of the nozzles 54 decreases with reduced pitch if the number of nozzles remains the same. Therefore, reducing the pitch of the nozzles 54 allows the application rate of the protective film material to be reduced as long as the number of nozzles is not increased. In the present invention, x and y are both equal to d×√2/2 or less, so the droplets of the protective film material on the color filter substrate 10a can be joined together without varying the pitch P of the nozzles 54 in the main scanning direction even if y is equal to 14 times the value of x. Thus, a CF protective film 20 can be formed without reducing the application rate of the protective film material.

The angle of contact β of the protective film material on the color filter is preferably 10 degrees or less (FIG. 3-3). Thus, the protective film material expands and becomes integrated with the adjacent droplets because the wettability of the protective film material with the color filter is sufficiently increased. A color filter protective film with a uniform thickness can thereby be formed even if the droplet intervals in the direction of nozzle alignment are greater than in the direction perpendicular to the direction of nozzle alignment.

Figures 3, 4, 5, 6, 7:
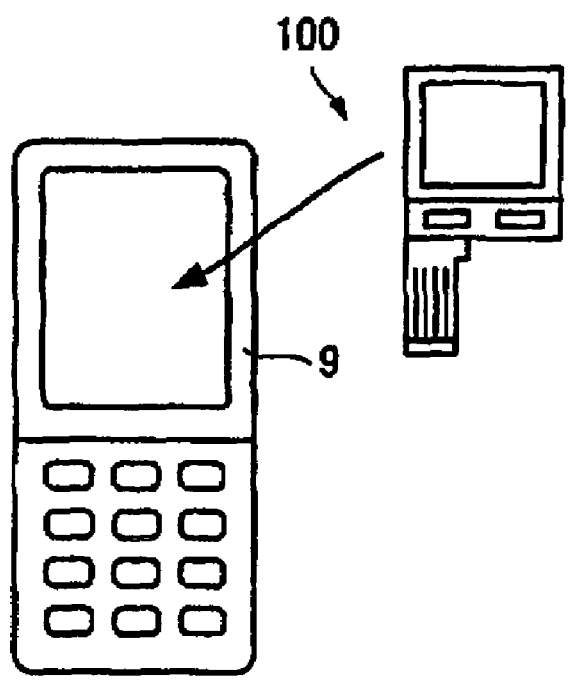
Figure 4:
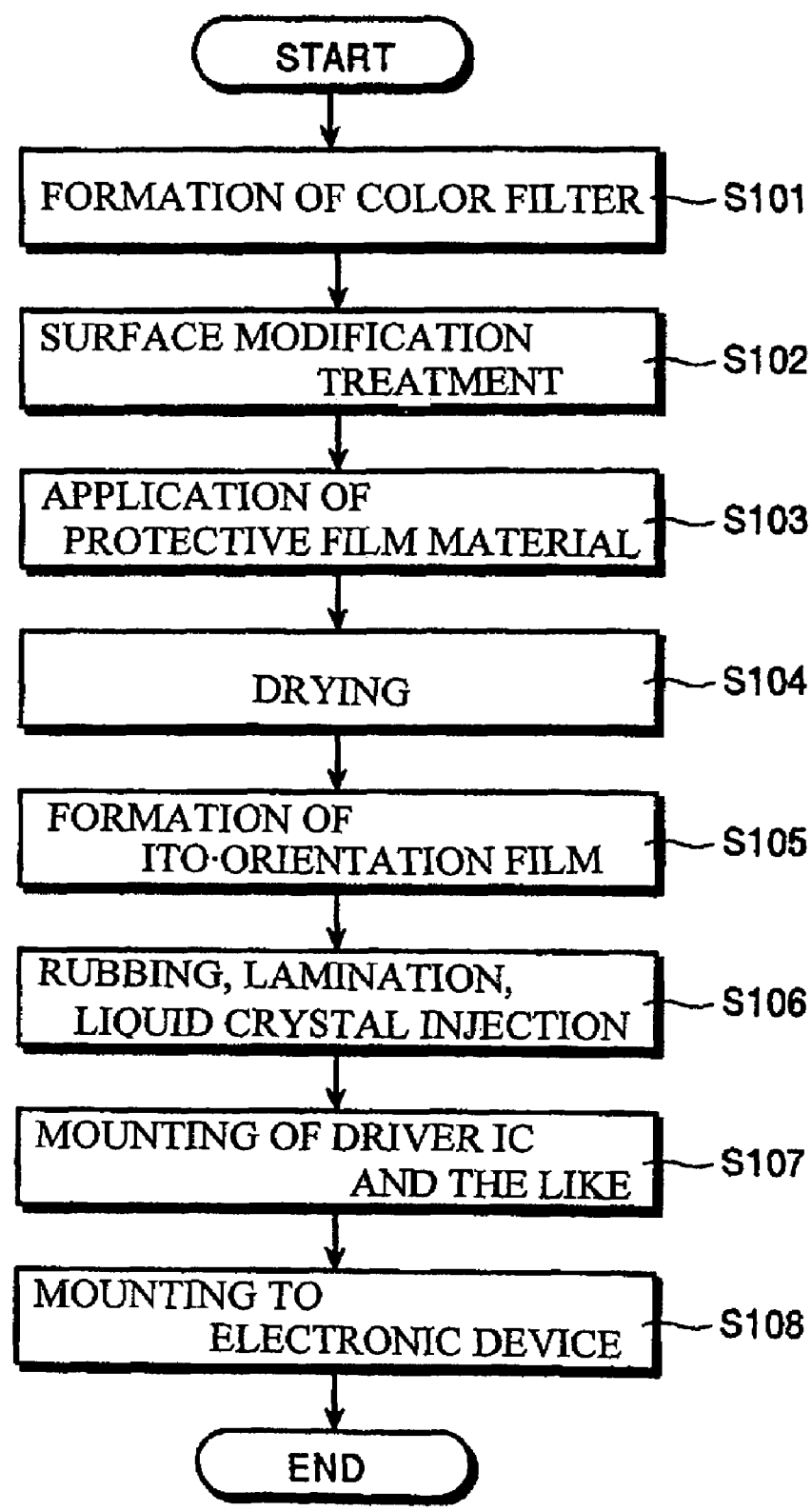
Figures 1, 5:
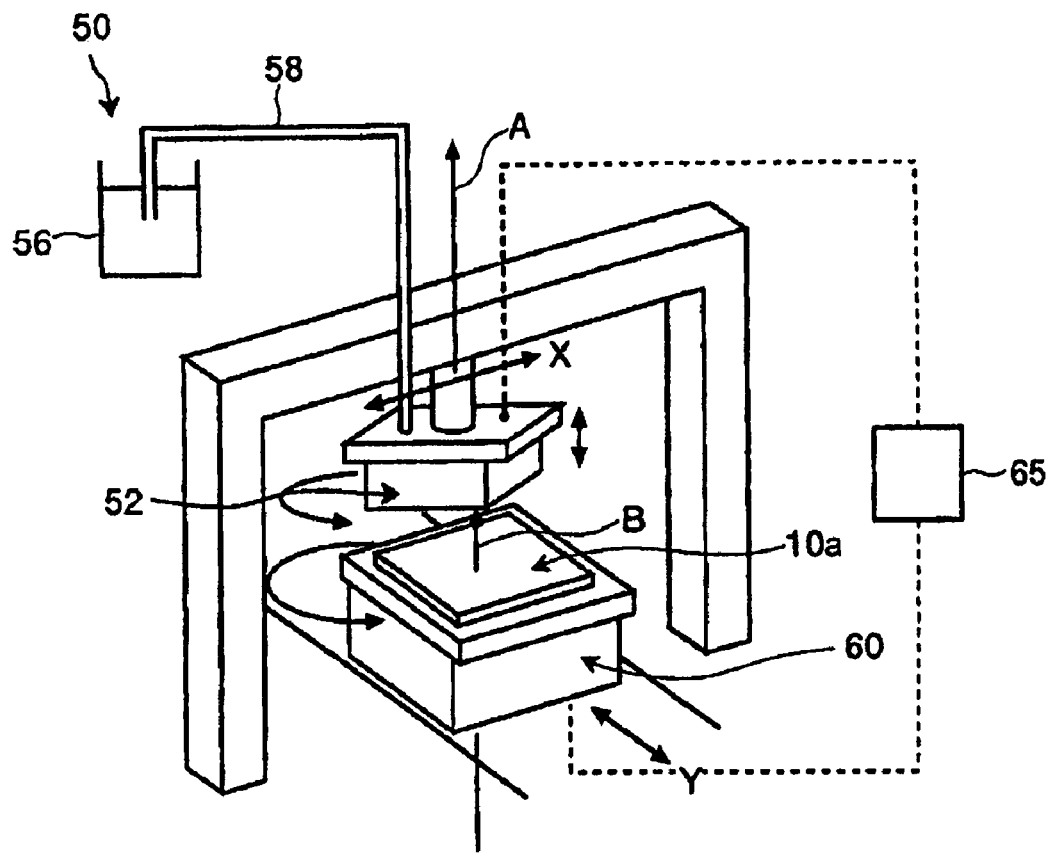
Figures 2, 5:
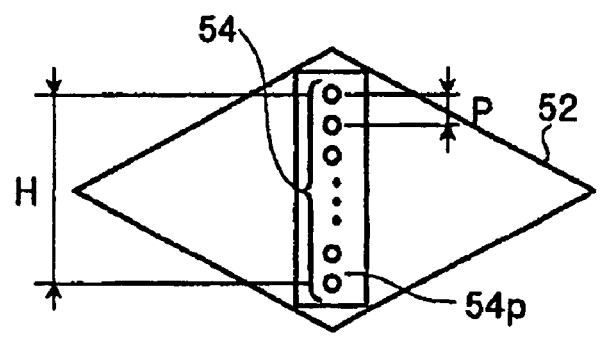
Figures 3, 5:
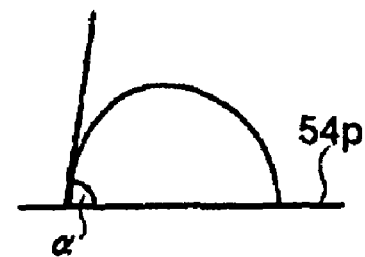
Figures 4, 5:
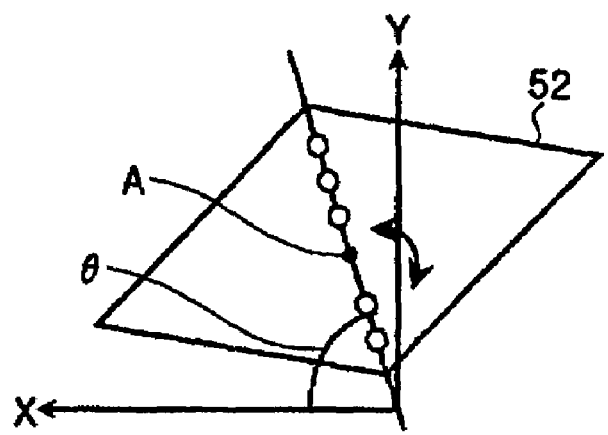
Figure 5:
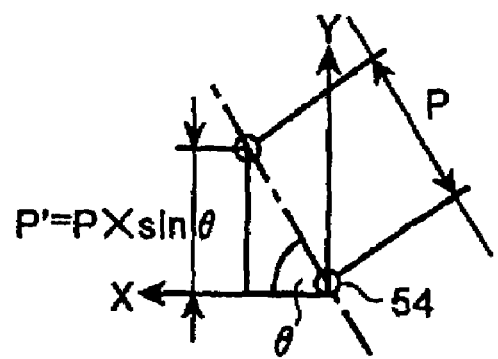
Figures 1, 6:
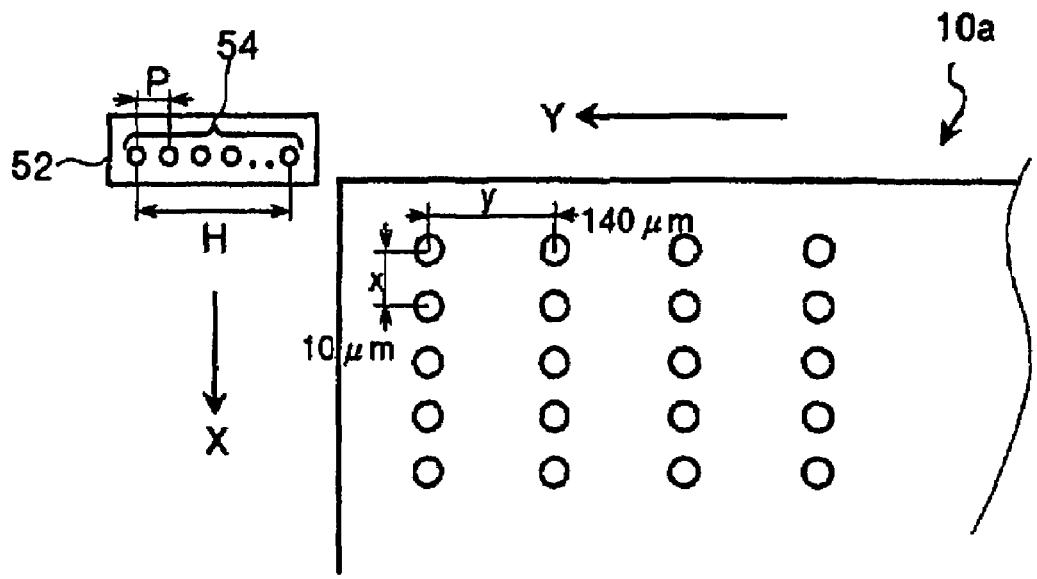
Figures 2, 6:
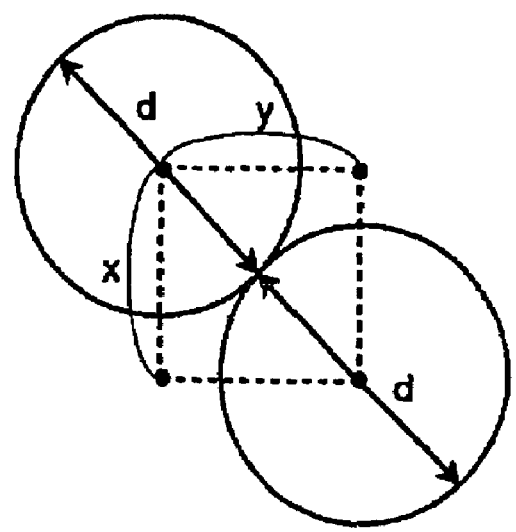
Figures 1, 7:
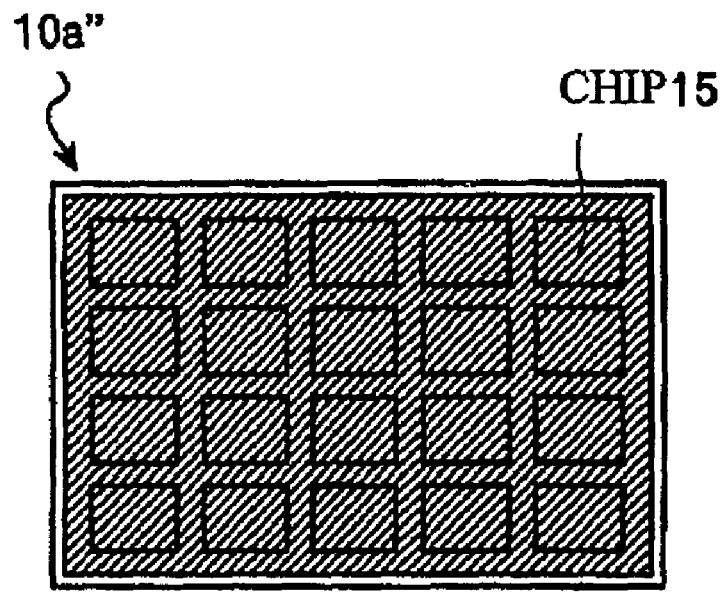
Figures 2, 7:
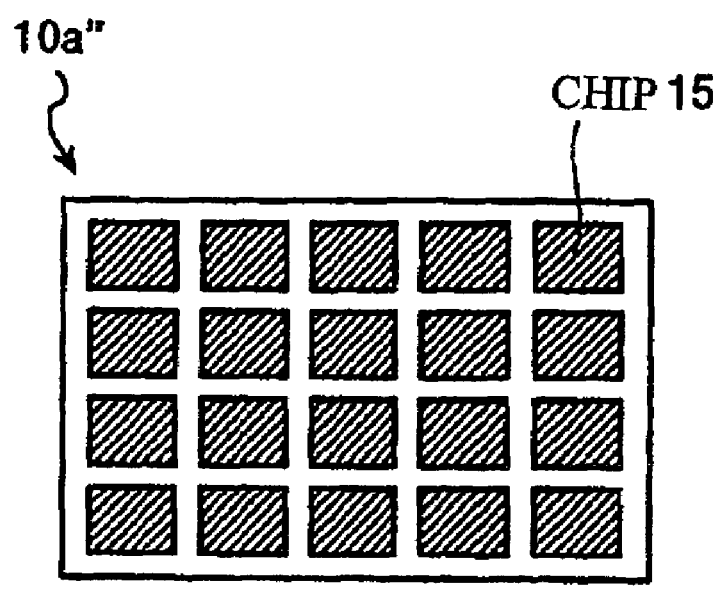

FIGS. 7-1 and 7-2 are explanatory diagrams showing the application pattern of the protective film material. The application pattern of the protective film material will now be described using FIG. 7. FIG. 7-1 shows an example wherein the protective film material is applied to the entire surface of the color filter substrate 10a'', which is the matrix, and FIG. 7-2 shows an example wherein the protective film material is applied to the area on which the color filter 11 is formed, or, specifically, to part of the color filter substrate 10a''. In the application example shown in FIG. 7-2, there is less waste of the protective film material because the protective film material is applied only to the necessary areas. In the application example shown in FIG. 7-2, the protective film material is applied to the entire surface of the color filter substrate 10a''. The CF protective film of uniform thickness can therefore be formed with greater ease on a chip 15 with smaller dimensions than the color filter substrate 10a''. Any application pattern can be selected with consideration for the manufacturing costs. The chip 15 herein constitutes one electro-optical panel. The protective film material can be easily applied in accordance with these application patterns by inputting the control data of the droplet discharge head 52 and stage 60 that correspond to these application patterns to the control device 65.

In droplet discharge, droplets of the protective film material must be discharged in a stable manner from the nozzles 54. Therefore, the protective film material is adjusted to have physical property values suitable for droplet discharge. Specifically, the viscosity at 20° C. is 1 to 20 mPa·s, and, similarly, the surface tension at 20° C. is 20 to 70 mN/m. In these ranges, the protective film material can be supplied in a stable manner to the nozzles 54, and the meniscus of the protective film material solution at the outlet of the nozzles 54 is also stabilized. Thus, droplets of the protective film material are discharged from the nozzles 54 in a stable manner and a high-quality CF protective film 20 can be formed. Also, the discharge capabilities of the piezoelement are not exceeded because the energy required for droplet discharge does not increase excessively as long as these ranges of viscosities and surface tensions are maintained.

Furthermore, it is more preferable that the viscosity at 20° C. is 4 to 8 mPa·s, and the surface tension at 20° C. is 25 to 35 mN/m. In these ranges, the protective film material can be supplied to the nozzles 54 in a more stable manner and the meniscus of the protective film material solution in the outlet of the nozzles 54 is stabilized. Thus, droplets of the protective film material are discharged from the nozzles 54 in a more stable manner and a high-quality CF protective film 20 can be formed.

The protective film material as a functional solution will now be described. The protective film material contains at least one of the following: an acrylic resin, an epoxy resin, an imide resin, and a fluorine resin. After the solvent in the protective film material is volatilized, these resins form the CF protective film 20 of the color filter 11. Also, the solvent of the resin contains at least one of the following: glycerin, diethylene glycol, methanol, ethanol, water, 1,3-dimethyl-2-imidazolidinone, ethoxyethanol, N,N-dimethyl formamide, N-methyl-2-pyrrolidone, ethylene glycol monomethyl ether acetate, propylene glycol monomethyl ether acetate, ethyl lactate, 3-methoxy methyl propionate, 3-ethoxy ethyl propionate, butyl acetate, 2-heptanone, propylene glycol monomethyl ether, γ-butyrolactone, diethylene acetate glycol monobutyl ether, diethylene glycol methyl ether, and diethylene glycol methylethyl ether. The viscosity and surface tension are adjusted by the mixture ratio of the resin and the solvent.

A solvent with a high boiling point is preferred from among these solvents. The protective film material does not immediately dry when applied to the color filter substrate 10*a* because a solvent with a high boiling point is slow to dry. As a result, a sufficient amount of time can be ensured for the thickness of the protective film material on the color filter substrate 10*a* to become uniform, so a CF protective film 20 of uniform thickness can be obtained. Also, nozzle clogging due to precipitation of the solids near the nozzles can be prevented. To obtain such effects, the boiling point of the solvent is preferably kept at 180° C. or greater, and more preferably 200° C. or greater, in order to form a CF protective film 20 with a more uniform thickness. Of the above-mentioned solvents, diethylene acetate glycol monobutyl ether is preferred for the method for manufacturing an electro-optical panel relating to the present invention because it has a boiling point of 246° C. Also, the boiling point can be adjusted to the desired level by combining the above-mentioned solvents.

Furthermore, the contact angle α (see FIGS. 5-2 and 5-3) between the protective film material and the nozzle plate 54*p*, which is a flat member, is preferably in a range of 30 to 170 degrees. When the contact angle α between the protective film material and the nozzle plate 54*p* is too small, the protective film material is shifted toward the nozzle plate 54*p* when the protective film material is discharged from the nozzles 54. As a result, the location at which the droplets of the protective film material adhere to the color filter substrate 10*a* is misaligned and the film thickness of the CF protective film 20 may not be uniform. If the contact angle α is in the above-mentioned range, the protective film material does not shift toward the nozzle plate 54*p* and the droplets of the protective film material adhere to a specific location on the color filter substrate 10*a*. The above-mentioned contact angle α is preferably 50 degrees or greater, and is more preferably 80 degrees or greater, for the droplets of the protective film material to adhere to a specific location in a more stable manner.

The nozzle plate 54*p* is subjected to a fluid repellent treatment, for example, to keep the contact angle α between the protective film material and the nozzle plate 54*p* in the above-mentioned range. The fluid repellent treatment is performed by coating the nozzle plate 54*p* with a fluid repellent material. A fluorine-containing silane-coupling agent can be used as such a material. Specifically, trifluoropropyl trichlorosilane is used as a fluid repellent material, and the nozzle plate 54*p* is coated with a solution thereof diluted to a concentration of 0.1% with ethanol as a solvent. In addition to trifluoropropyl trichlorosilane, it is also possible to use heptadecafluorodecyl trichlorosilane, trifluoropropyl trimethoxysilane, heptadecatrifluorodecyl trimethoxysilane, or another such fluorine-containing silane-coupling agent can be used as a surface-modifying agent. The term "fluid-repellent" refers to the repelling of the protective film material by the nozzle plate 54*p*, and any treatment that reduces the wettability between the two can be considered a fluid repellent treatment.

When applied to the color filter substrate 10*a*, the protective film material is dried in order to volatilize the solvent in the protective film material (step S104). In the present embodiment, the substrate 1 on which the droplets of the protective film material are applied is mounted on a hot plate 67, and the solvent in the protective film material is volatilized as shown in FIG. 3-5. At this point, drying is preferably performed for a certain amount of time at a relatively low temperature in order to smooth the surface of the CF protective film 20. Specifically, a period of five minutes or greater is preferably needed at 70° C. or less. To further smooth the surface of the CF protective film 20, 10 minutes or greater at 50° C. or less is preferred, and one hour or more at 30° C. or less is more preferred. The drying method is not limited to the hot plate 67, and drying may also be performed by heating with an infrared heater or in an oven. Thus, the solvent in the protective film material is volatilized and the CF protective film 20 is formed on the color filter substrate 10*a*.

Next, the ITO electrode 14 and the orientation film 16 are formed on the CF protective film 20 (step S105). Then, a step for rubbing the orientation film 16, a step for laminating the color filter substrate 10*a* and the opposing substrate 10*b*, and a step for injecting the liquid crystal are performed (step S106), and the electro-optical panel 100 is completed. A harness or FPC (flexible printed circuit) 7, or a driver IC 5 is mounted on the completed electro-optical panel 100 (step S107) as shown in FIG. 3-6. The resulting assembly is then mounted on a portable phone, PDA, or other such electronic device 9 as shown in FIG. 3-7, and these electronic devices are completed (step S108).

According to the present invention as described above, the droplet intervals in the direction of nozzle alignment are greater than in the direction perpendicular to the direction of nozzle alignment. Thus, the productivity of the electro-optical panel can be improved because the color filter protective film can be formed without reducing the application speed of the protective film material. Also, in the present invention, the amount of the protective film material used can be reduced compared with conventional spin coating because a CF protective film is formed using droplet discharge. Also, since there is no need to perform a step for washing the back surface of the color filter substrate, the time for manufacturing the electro-optical panel and the electro-optical device can be shortened, and there is also no need for a cleaning solution.

Embodiment 2

Figure 8:
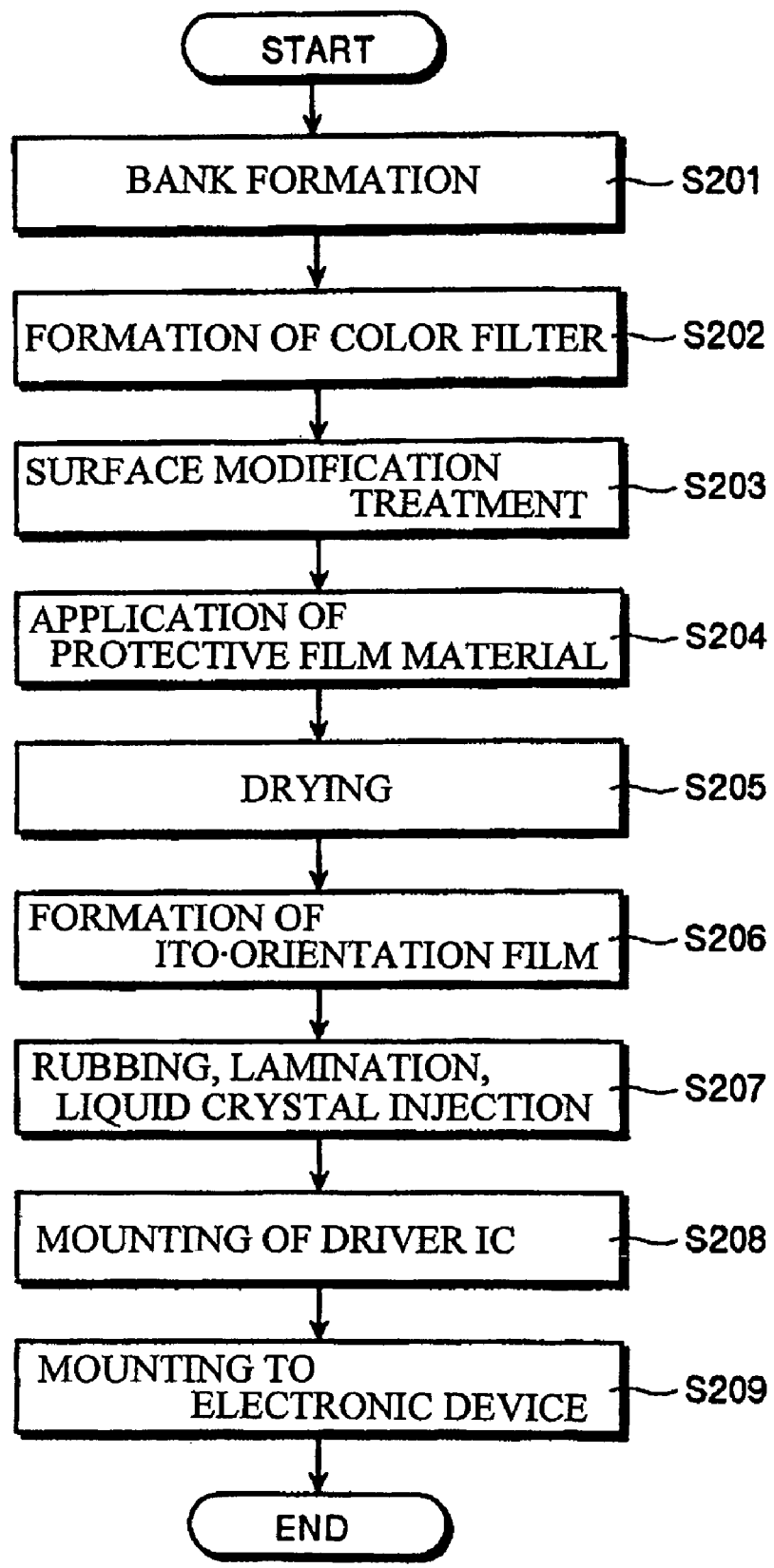
FIG. 8 is a flow chart showing a method for manufacturing an electro-optical panel and electronic device relating to Embodiment 2.
Figure 9:
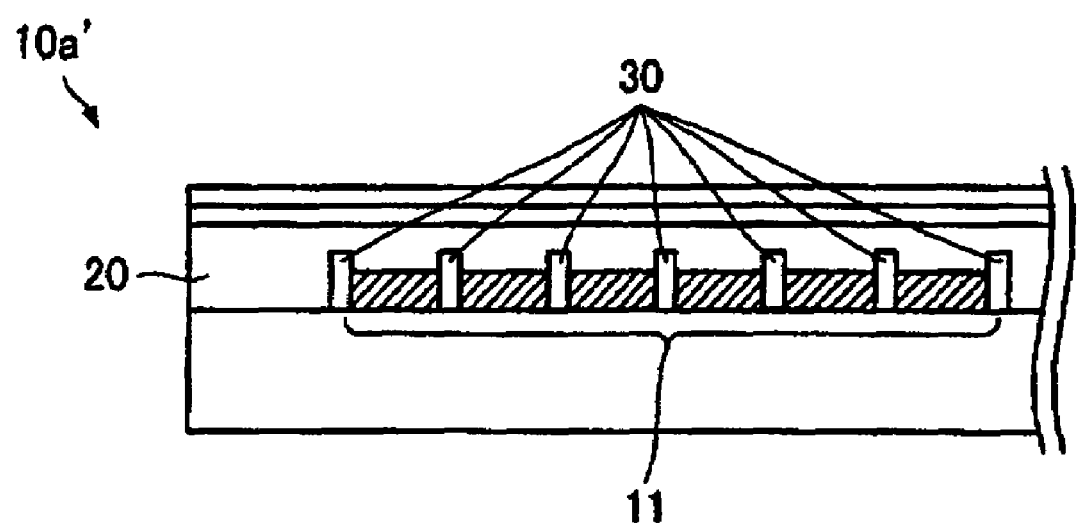
FIG. 9 is an explanatory diagram showing a CF substrate of the electro-optical panel relating to Embodiment 2.

FIG. 8 is a flowchart showing the method for manufacturing the electro-optical panel and an electronic device relating to Embodiment 2. FIG. 9 is an explanatory diagram showing the CF substrate of the electro-optical panel relating to Embodiment 2.

The method for manufacturing the electro-optical panel and the electronic device relating to Embodiment 2 differs in that banks (barrier walls) are provided, a color filter 11 is formed therein, and a CF protective film 20 is then formed on the color filter 11. Otherwise the configuration is the same as in Embodiment 1, so redundant descriptions are omitted and the same structural elements are denoted by the same symbols.

First, banks 30 are formed on the substrate 1 (step S201), and sections for forming the color filter 11 are formed. The banks 30 are formed by applying an ink-repellent resin in a specific thickness by spin coating, for example, and then partitioning the thin resin film into a lattice configuration by using photolithography or another such patterning technique. The term "ink-repellent" refers to the property of low wettability by the filter ink in which a colored resin is dissolved in a solvent.

Next, the color filter 11 is formed (step S202). The color filter 11 can be formed by coating the insides of the sections separated off by the banks 30 with a color filter ink in which a colored resin is dissolved in a solvent, using a droplet discharge system. The color filter ink can be applied inside the sections with the aid of the banks 30 formed by the ink-repellent resin, even when the color filter ink is discharged somewhat out of alignment towards the inside of the sections separated off by the banks 30. The droplet discharge device 50 (see FIG. 5) relating to Embodiment 1 can be used for such droplet discharge.

When the color filter 11 is formed on the substrate 1, the color filter 11 is subjected to a surface modification treatment (step S203). The reason for this is as explained in Embodiment 1. The portion with the banks 30 is subjected to a thorough surface modification treatment to form the CF protective film 20 with a uniform thickness because the banks 30 are formed from an ink-repellent resin. After the surface modification treatment, the color filter 11 is coated with the protective film material by droplet discharge (step S204). After the protective film material is applied, drying is performed (step S205), an ITO and an orientation film are formed (step S206), and the color filter substrate 10a' is completed. Descriptions of the subsequent steps are omitted because they are the same as steps S106 through S108 of the method for manufacturing an electro-optical panel and an electronic device relating to Embodiment 1.

Thus, the present invention can be applied even to an electro-optical panel on which a color filter 11 is formed in sections separated off by banks. Also, the amount of the protective film material used can be reduced compared with conventional spin coating, and the time for manufacturing the electro-optical panel and the electro-optical device can be shortened since there is no need to perform a step for washing the back surface of the color filter substrate.

Embodiment 3

Figures 1, 10:
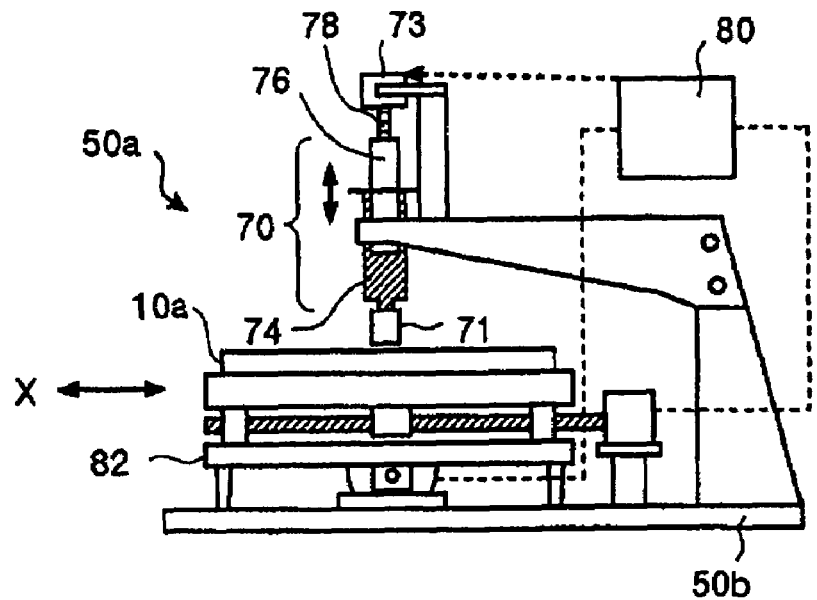
Figures 2, 10:
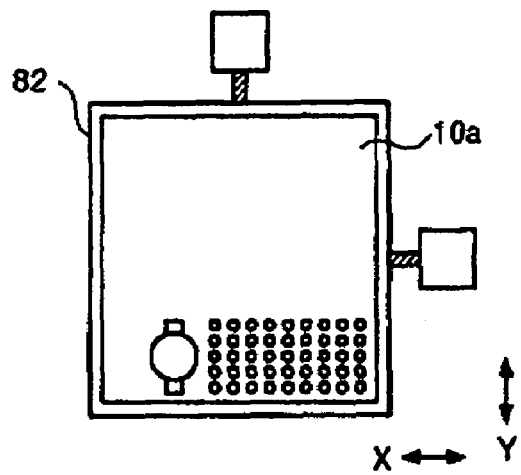
Figures 3, 10:
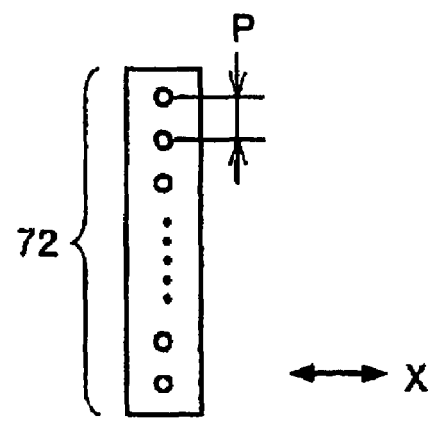

FIGS. 10-1 through 10-3 are explanatory diagrams showing the droplet discharge device relating to Embodiment 3. The droplet discharge device 50a is such that a plunger is used for droplet discharge. The plunger 70 is configured from a cylinder 74 with a nozzle head 71 on the tip, and a piston 76 inserted therein. The nozzle head 71 is made of a plurality of nozzles 72 arranged at a specific pitch P as shown in FIG. 10-2. Also, the protective film material accumulates in the cylinder 74, and the piston 76 is moved toward the nozzle head 71, whereby the protective film material is discharged from the nozzles 72.

A feed screw 78 is mounted on the piston 76, and rotating a stepping motor 73 on which the feed screw 78 is mounted causes the piston 76 to move toward the nozzle head 71. The stepping motor 73 is rotated a specific number of rotations according to a command from a control part 80. When the feed screw 78 rotates, the piston 76 moves the distance of the pitch PS of the feed screw 78. Also, it is possible to control the discharge amount of the protective film material according to the number of rotations of the feed screw 78 because of a proportional relation between the moving distance of the piston 76 and the discharge amount of the protective film material.

The color filter substrate 10a is mounted on an X-Y stage 82 and is capable of moving in the X and Y directions. The plunger 70 is mounted on the device main body 50b such that the direction of alignment of the nozzles 72 is parallel to the Y direction. When the CF protective film 20 is formed on the color filter substrate 10a, first the X-Y stage is moved, and the starting location for applying the protective film material on the color filter substrate 10a is determined. Next, a specific amount of the protective film material is applied to a light-distributing substrate from the nozzles 72 by rotating the stepping motor 73 to a specific degree according to a command from the control part 80.

Next, the X-Y stage 82 is moved a specific width in the X direction according to a command from the control part 80, and a specific amount of the protective film material is similarly applied to the light-distributing substrate from the nozzles 72. When this procedure is repeated along the width of the color filter substrate 10a, the protective film material can be applied across the alignment width H of the nozzles 72 in the width direction (X direction) of the color filter substrate 10a. Next, the X-Y stage 82 is moved in the Y direction over a distance equal to the alignment width H of the nozzles 72 according to a command from the control part 80, and the protective film material is applied in the next line in the Y direction by repeating the above-mentioned procedure. The CF protective film 20 can be formed on the color filter substrate 10a by repeating this procedure in the Y direction of the color filter substrate 10a. Thus, the CF protective film 20 can be formed on the color filter substrate 10a in the same manner as with ink jetting even when a plunger is used for droplet discharge.

Embodiment 4

In Embodiment 4, a color filter, a liquid crystal display device, an organic EL device, a plasma display (PDP device), an electron emission device (FED device, SED device), and an active matrix substrate formed on these display devices are given as examples of the electro-optical apparatus (flat panel display) manufactured using the method for manufacturing an electro-optical panel or the method for manufacturing an electronic device relating to the present invention, and the structures and manufacturing methods thereof are described. The term "active matrix substrate" refers to a substrate on which is formed a thin film transistor, and a source line and data line electrically connected to the thin film transistor.

First, the method for manufacturing a color filter to be incorporated into a liquid crystal display device or an organic EL device or the like will be described. In this case, the color filter is the functional film, and the filter material serves as the functional liquid.

Figure 11:
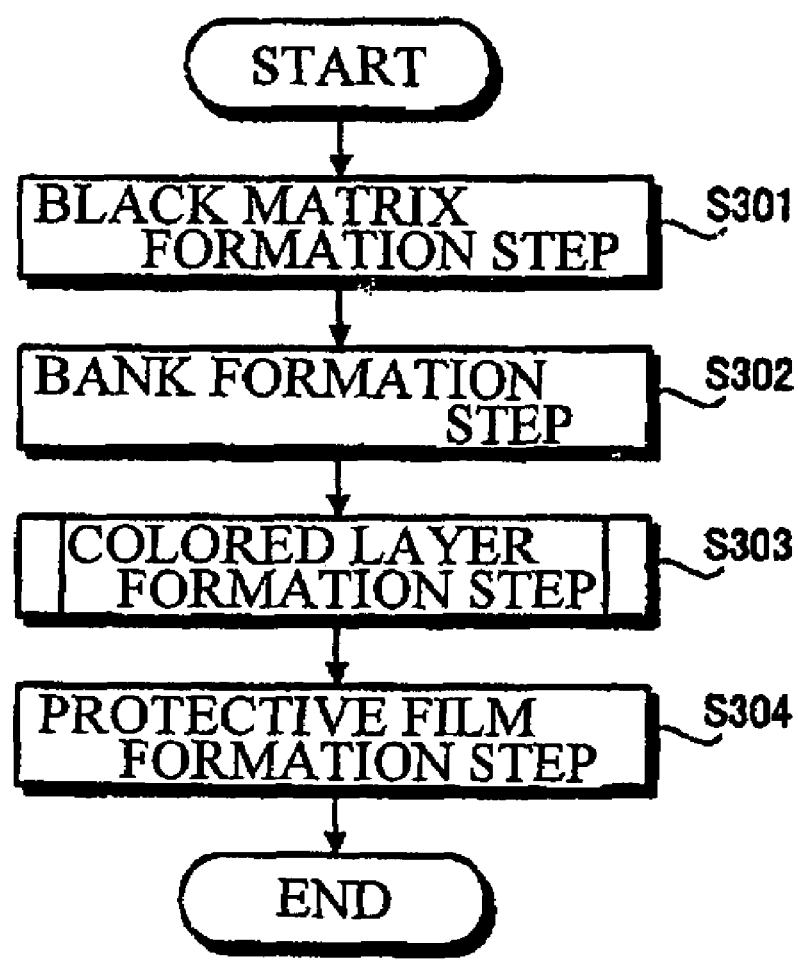
FIG. 11 is a flow chart showing the process of manufacturing a color filter.
Figures 1, 12:
Figures 2, 12:
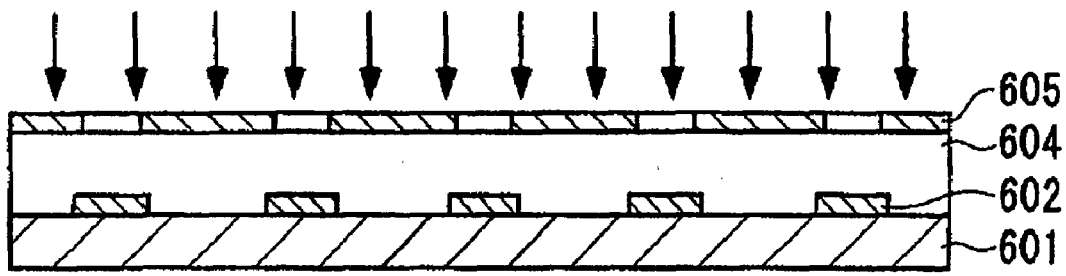
Figures 3, 12:
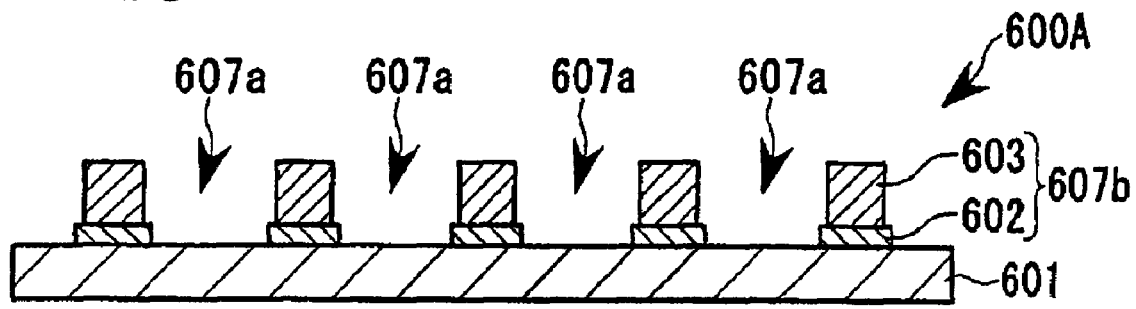
Figures 4, 12:
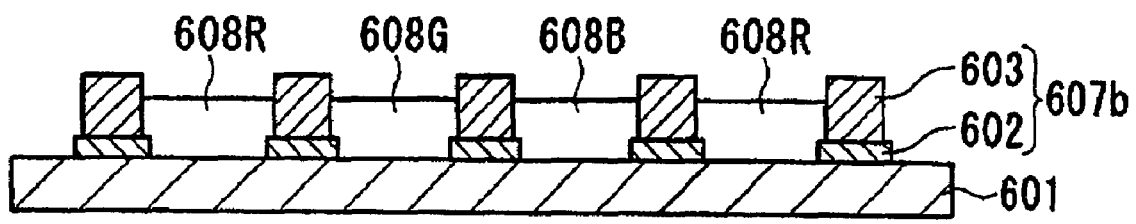
Figures 5, 12:
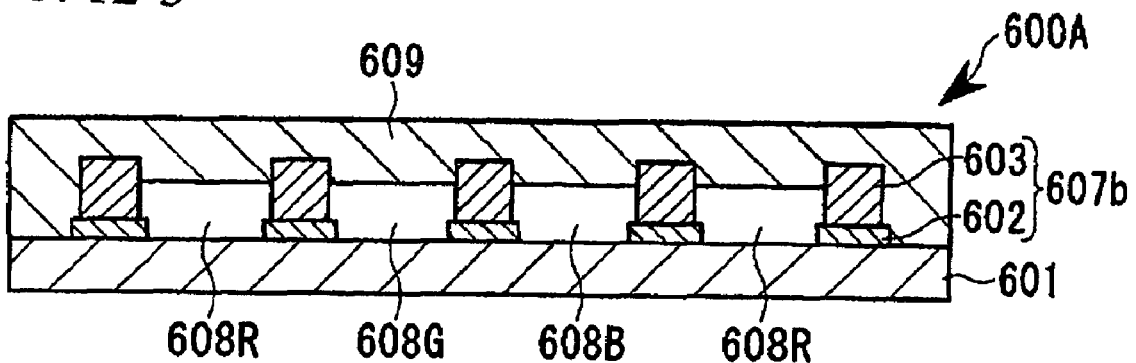

FIG. 11 is a flow chart showing the process of manufacturing a color filter, and FIGS. 12-1 through 12-5 are schematic cross-sectional views of the color filter 600 (filter substrate 600A) of the present embodiment shown in the sequence of the manufacturing steps. First, in the black matrix formation step (step S301), a black matrix 602 is formed on a substrate (W) 601 as shown in FIG. 12-1. The black matrix 602 is formed from chromium metal, a chromium metal/chromium oxide laminate, resin black, or the like. Sputtering, vapor deposition, or the like can be used to form a black matrix 602 made from a metal thin film. Gravure printing, photoresist methods, thermal transfer methods, or the like can be used to form a black matrix 602 made from a resinous thin film.

Next, in the bank formation step (step S302), a bank 603 is formed in superposed fashion on the black matrix 602. Specifically, a resist layer 604 made from a negative transparent photosensitive resin is first formed to cover the substrate 601 and the black matrix 602, as shown in FIG. 12-2. The top surface thereof is then subjected to exposure treatment while covered by a mask film 605 formed in a matrix pattern. Furthermore, the resist layer 604 is patterned by subjecting the unexposed portion of the resist layer 604 to etching treatment to form the banks 603, as shown in FIG. 12-3. It is possible to use the black matrix and the banks together when forming a black matrix from resin black. The banks 603 and the underlying black matrix 602 form dividing walls 607b that divide the pixel areas 607a and determine the areas for accepting functional droplets when colored layers (film parts) 608R, 608G, and 608B are formed by a functional droplet discharge head 51 in the subsequent colored layer formation step.

The filter substrate 600A is obtained by the black matrix formation step and the bank formation step described above. A resinous material whose coating surface is lyophobic (hydrophobic) is used for the banks 603 in the present embodiment. The precision with which the droplets strike the pixel electrodes 607a enclosed by the banks 603 (dividing walls 607b) in the colored layer formation step to be later described is improved because the surface of the substrate (glass substrate) 601 is lyophilic (hydrophilic).

Next, in the colored layer formation step (step S303), functional droplets are discharged by the functional droplet discharge head 51 and are made to strike the pixel electrodes 607a enclosed by the dividing walls 607b, as shown in FIG. 12-4. In this case, functional liquids (filter material) of the three colors R, •G, and •B are introduced using the functional droplet discharge head 51, and the functional droplets are discharged by the method for manufacturing an electro-optical panel described in Embodiment 1. The three colors R, •G, •B may have a striped alignment, a mosaic alignment, a delta alignment, or the like.

The functional liquid is then set by a drying treatment (heating or another such treatment), and three colored layers 608R, 608G, and 608B are formed. When the colored layers 608R, 608G, and 608B are formed, the protective film formation step (step S304) begins and a protective film 609 is formed to cover the top surfaces of the substrate 601, the dividing walls 607b, and the colored layers 608R, 608G, and 608B, as shown in FIG. 12-5. Specifically, the protective film 609 is formed by a drying treatment after the protective film coating solution is discharged over the entire surface of the substrate 601 on which the colored layers 608R, 608G, and 608B are formed. Then, after the protective film 609 is formed by the method for manufacturing an electro-optical panel described in Embodiment 1, the process continues with a step for affixing the color filter 600 or ITO (indium tin oxide) or the like, which serves as the transparent electrode in the next step.

Figure 13:
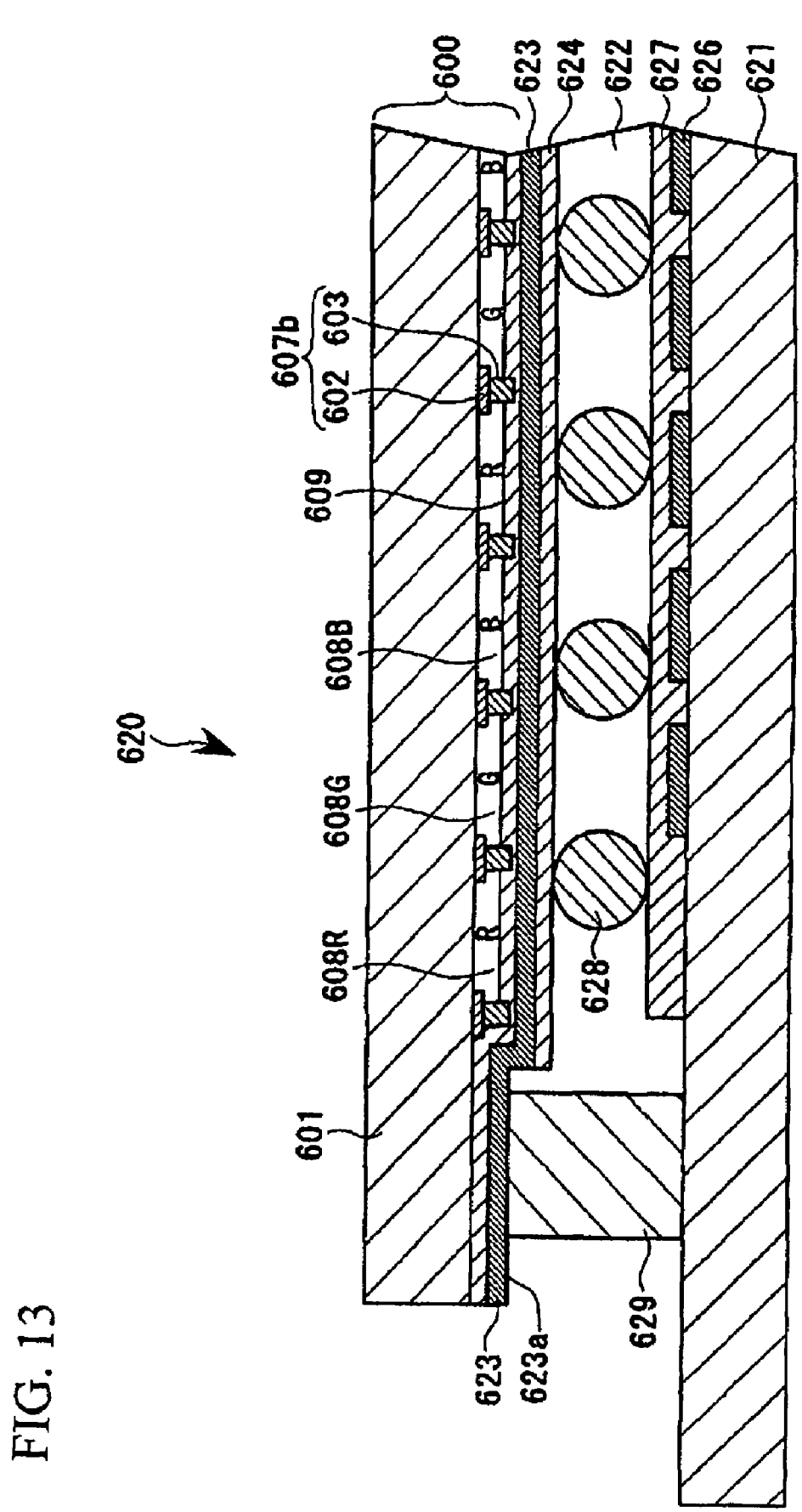
FIG. 13 is a partial cross-sectional view showing the overall structure of a passive matrix-type liquid crystal display panel as an example of a liquid crystal display device that uses a color filter.

FIG. 13 is a partial cross-sectional view showing the overall structure of a passive matrix-type liquid crystal display panel (liquid crystal display panel) as an example of a liquid crystal display device that uses the color filter 600. The final product, a transparent liquid crystal display device, is obtained by mounting a liquid crystal drive IC, a backlight, a support body, and other such accessory elements on this liquid crystal display panel 620. Since the color filter 600 is identical to that shown in FIG. 12, the corresponding parts are denoted by the same symbols and descriptions thereof are omitted.

The liquid crystal display panel 620 is essentially configured from the color filter 600, an opposing substrate 621 made from a glass substrate or the like, and a liquid crystal layer 622 made from an STN (super twisted nematic) liquid crystal composition held therebetween, and the color filter 600 is disposed on the top side in the diagram (the side of the observer). Though not shown, polarization plates are provided to the outer surfaces of both the opposing substrate 621 and the color filter 600 (the surfaces opposite the liquid crystal layer 622), and a backlight is provided to the outer side of the polarization plate located next to the opposing substrate 621.

A plurality of long rectangular first electrodes 623 is formed at specific horizontal intervals in FIG. 13 on the protective film 609 of the color filter 600 (next to the liquid crystal layer), and a first orientation film 624 is formed to cover the surface of the first electrodes 623 opposite the color filter 600. A plurality of long rectangular second electrodes 626 is formed at specific intervals perpendicular to the first electrodes 623 of the color filter 600 on the surface of the opposing substrate 621 that faces the color filter 600, and a second orientation film 627 is formed to cover the surface of the second electrodes 626 next to the liquid crystal layer 622. The first electrodes 623 and second electrodes 626 are formed from ITO or another such transparent conductive material.

The spacers 628 provided within the liquid crystal layer 622 are members for maintaining a constant thickness in the liquid crystal layer 622 (cell interval). The seal member 629 is a member for preventing the liquid crystal composition in the liquid crystal layer 622 from leaking out. One end of the first electrodes 623 extends past the seal member 629 as a lead wire 623a. The area in which the first electrodes 623 and the second electrodes 626 intersect constitutes a pixel, and the colored layers 608R, 608G, and 608B of the color filter 600 are located in the area constituting this pixel.

In a regular manufacturing process, the portion next to the color filter 600 is created by patterning first electrodes 623 and applying a first orientation film 624 onto the color filter 600, and the portion next to the opposing substrate 621 is created by patterning separate second electrodes 626 and applying a second orientation film 627 onto the opposing substrate 621. The first orientation film 624 and the second orientation film 627 can be fabricated by the method for manufacturing an electro-optical panel described in Embodiment 1. The spacers 628 and the seal member 629 are then incorporated into the portion next to the opposing substrate 621, and the portion next to the color filter 600 is affixed in this state. Next, the liquid crystal constituting the liquid crystal layer 622 is introduced through the inlet of the seal member 629, and the inlet is closed up. Both polarization plates and the backlight are then laminated together.

In addition to applying, for example, the spacer material (functional liquid) constituting the above-mentioned cell gaps with the aid of the droplet discharge device 50 in Embodiment 1, it is possible to apply uniformly liquid crystal (functional liquid) onto the areas enclosed by the seal member 629 before the portion next to the color filter 600 is affixed to the portion next to the opposing substrate 621. It is also possible to print on the above-mentioned seal member 629 with the functional droplet discharge head 51. It is further possible to apply the first and second orientation films 624 and 627 with the functional droplet discharge head 51. The method for manufacturing an electro-optical panel described in Embodiment 1 is used when these functional liquids are discharged.

Figure 14:
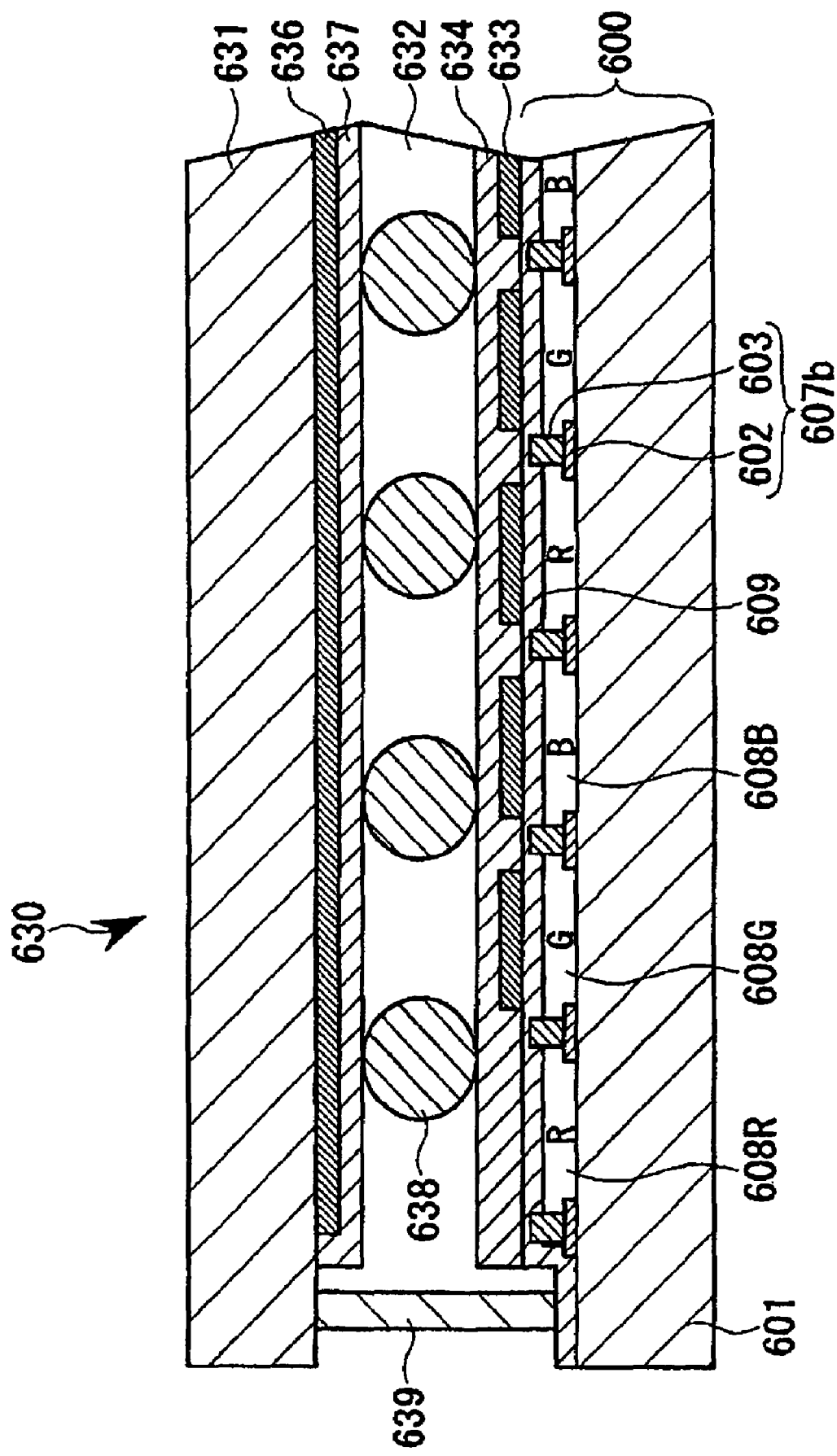
FIG. 14 is a partial cross-sectional view showing the overall structure of a second example of a liquid crystal display panel that uses the color filter manufactured in the present embodiment.

FIG. 14 is a partial cross-sectional view showing the overall structure of a second example of a liquid crystal display panel that uses the color filter 600 manufactured according to the present embodiment. One significant difference between this liquid crystal display panel 630 and the liquid crystal display panel 620 is that the color filter 600 is disposed in the lower side of the diagram (the side opposite from the observer). In the overall structure of the liquid crystal display panel 630, a liquid crystal layer 632 made from STN liquid crystal is sandwiched between the color filter 600 and an opposing substrate 631 made from a glass substrate or the like. Though not shown in the diagram, polarization plates or the like are provided to the outer surfaces of both the opposing substrate 631 and the color filter 600.

A plurality of long rectangular first electrodes 633 is formed at specific intervals on the protective film 609 of the color filter 600 (next to the liquid crystal layer 632) in the depth direction in the diagram, and a first orientation film 634 is formed to cover the surfaces of the first electrodes 633 next to the liquid crystal layer 632. A plurality of second electrodes 636 extending in a direction perpendicular to the first electrodes 633 next to the color filter 600 is formed at specific intervals on the surface of the opposing substrate 631 facing the color filter 600, and a second orientation film 637 is formed to cover the surfaces of the second electrodes 636 next to the liquid crystal layer 632.

The liquid crystal layer 632 is provided with spacers 638 for maintaining a constant thickness in the liquid crystal layer 632, and a seal member 639 for preventing the liquid crystal composition in the liquid crystal layer 632 from leaking to the exterior. As with the liquid crystal display panel 620 described above, the area in which the first electrodes 633 and the second electrodes 636 intersect constitutes a pixel, and is configured such that the colored layers 608R, 608G, and 608B of the color filter 600 are located in the area constituting this pixel.

Figure 15:
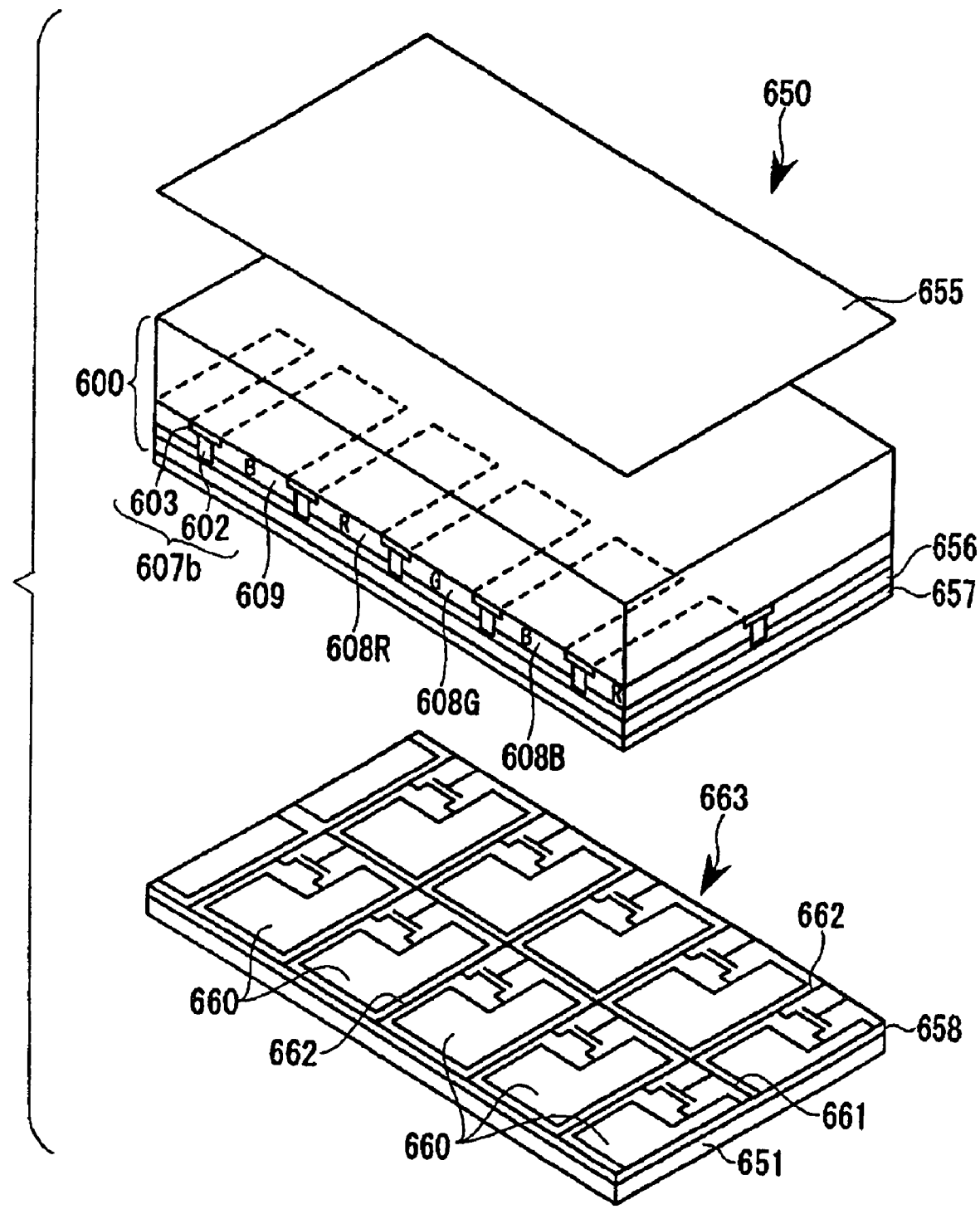
FIG. 15 is an exploded perspective view showing a third example wherein a liquid crystal display panel is configured using a color filter to which the present invention is applied, and shows the overall structure of a transparent TFT (thin film transistor) liquid crystal display panel.

FIG. 15 is an exploded perspective view showing a third example wherein a liquid crystal display panel is configured using the color filter 600 to which the present invention is applied, and shows the overall structure of a transparent TFT (thin film transistor) liquid crystal display panel. In this liquid crystal display panel 650, the color filter 600 is disposed in the upper side of the diagram (the same side as the observer).

This liquid crystal display panel 650 is essentially configured from a color filter 600, an opposing substrate 651 disposed to face the color filter, a liquid crystal layer (not shown) held therebetween, a polarization plate 655 disposed on the upper side of the color filter 600 (the same side as the observer), and a polarization plate (not shown) provided on the lower side of the opposing substrate 651. A liquid crystal driving electrode 656 is formed on the surface of the protective film 609 of the color filter 600 (the surface next to the opposing substrate 651).

The electrode 656 is made from ITO or another such transparent conductive material, and is a full electrode that covers the entire area in which a hereinafter-described pixel electrode 660 is formed. Also, an orientation film 657 is provided to cover the surface of the electrode 656 opposite the pixel electrode 660.

An insulation layer 658 is formed on the surface of the opposing substrate 651 facing the color filter 600, and a scanning wire 661 and signal wire 662 are formed perpendicular to each other on the insulation layer 658. The pixel electrode 660 is then formed in the area enclosed by the scanning wire 661 and the signal wire 662. An orientation film is provided on the pixel electrode 660 in the actual liquid crystal display panel, but is omitted in the diagram.

Also, the portion of the pixel electrode 660 enclosed by the notch, the scanning wire 661, and the signal wire 662 is incorporated with a thin film transistor 663 equipped with a source electrode, a drain electrode, a semiconductor, and a gate electrode. The configuration is such that it is possible to turn the thin film transistor 663 on and off to control the supply of electrical currents to the pixel electrode 660 by applying signals to the scanning wire 661 and the signal wire 662. Each of the liquid crystal display panels 620, 630, and 650 described above is a transmission type, but it is possible to create a reflective liquid crystal display panel or a semi-transparent/reflective liquid crystal display panel by providing a reflective layer or a semi-transparent layer. The organic EL device will now be described.

Figure 16:
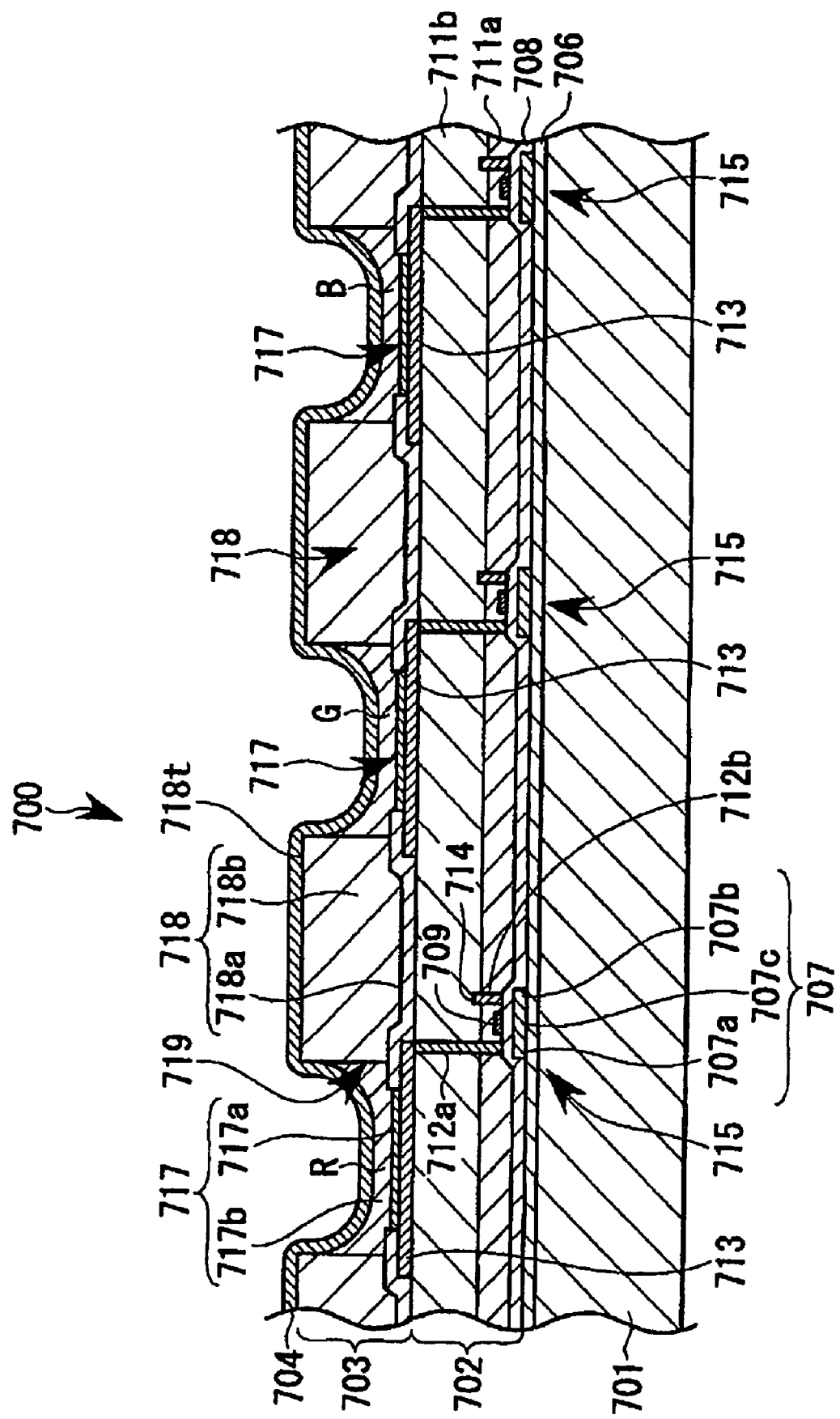
FIG. 16 is a partial cross-sectional view of the display area of an organic EL display device.

FIG. 16 is a partial cross-sectional view of the display area of an organic EL display device. This organic EL display device 700 is essentially configured with a circuit element 702, a light-emitting element 703, and a cathode 704 laminated to a substrate (W) 701. In the display device 700, light emitted from the light-emitting element 703 onto one side of the substrate 701 passes through the circuit element 702 and the substrate 701 to be emitted to an observer, while the light emitted from the light-emitting element 703 onto the other side of the substrate 701 is reflected by the negative electrode 704, and then passes through the circuit element 702 and the substrate 701 to be emitted to the observer.

A base protection film 706 having a silicon oxide film is formed between the circuit element 702 and the substrate 701, and an island shaped semiconductor film 707 composed of polycrystalline silicon is formed on the base protection film 706 (on the side facing the light-emitting element 703). A source area 707a and a drain area 707b are formed respectively in the left and right areas of the semiconductor film 707 by high-concentration cation implantation. The center section, which is not implanted with cations, constitutes a channel area 707c.

A transparent gate insulation film 708 covering the base protection film 706 and semiconductor film 707 is formed on the circuit element 702, and a gate electrode 709 configured from Al, Mo, Ta, Ti, W, or the like, for example, is formed at a location on the gate insulation film 708 corresponding to the channel area 707c of the semiconductor film 707. A transparent first layer insulation film 711a and a second layer insulation film 711b are formed on the gate electrode 709 and the gate insulation film 708. Also, contact holes 712a and 712b in communication with the source area 707a and drain area 707b, respectively, of the semiconductor film 707 are formed all the way through the first and second layer insulation films 711a and 711b. The gate electrode 709 and the gate insulation film 708 can be formed by discharging droplets of a functional liquid, which is obtained by dissolving the material that constitutes these elements in a solvent, according to the method for manufacturing an electro-optical panel relating to Embodiment 1.

Transparent pixel electrodes 713 composed of ITO or the like are then formed on the second layer insulation film 711b by being patterned into a specific shape, and these pixel electrodes 713 are connected to the source area 707a via the contact hole 712a. Also, a power wire 714 is disposed on the first layer insulation film 711a, and this power wire 714 is connected to the drain area 707b via the contact hole 712b.

Thus, thin-film drive transistors 715 that are connected to the pixel electrodes 713 are formed on the circuit element 702. The light-emitting element 703 is essentially configured from a plurality of function layers 717 laminated to each of the pixel electrodes 713, and bank parts 718 provided between each of the pixel electrodes 713 and the function layers 717 to partition off the function layers 717. The light-emitting element is configured from the pixel electrodes 713, the function layers 717, and the negative electrode 704 disposed on the function layers 717. The pixel electrodes 713 are formed by being patterned into a rough rectangular shape as viewed in a plane, and the bank parts 718 are formed between the pixel electrodes 713.

The bank parts 718 have inorganic bank layers 718a (first bank layers) formed from SiO, $SiO_2$, $TiO_2$, or another such inorganic material, for example; and also have organic bank layers 718b (second bank layers) that are trapezoid in cross section, are laminated to the inorganic bank layers 718a, and are formed from a polyimide resin or another such resist with excellent heat resistance and solvent resistance. A portion of the bank parts 718 is formed to be resting on the edge of the pixel electrodes 713. Openings 719 that gradually expand above the pixel electrodes 713 are formed between the bank parts 718.

The function layers 717 have hole injection/transportation layers 717a formed in a stacked state in the openings 719 on the pixel electrodes 713, and luminescent layers 717b formed on the hole injection/transportation layers 717a. Other function layers having other functions may also be formed adjacent to the luminescent layers 717b. For example, electron transportation layers can also be formed. The hole injection/transportation layers 717a have a function for transporting the holes from the side facing the pixel electrodes 713 and injecting them into the luminescent layers 717b. The hole injection/transportation layers 717a are formed by discharging a first composition (functional liquid) containing a material capable of forming a hole injection/transportation layer. The method for manufacturing an electro-optical panel described in Embodiment 1 is used when the first composition (functional liquid) is discharged. Conventional material is used as the material for forming a hole injection/transportation layer.

The luminescent layers 717b are caused to emit red (R), green (G), or blue (B) light, and are formed by discharging a second composition (functional liquid) containing a material for forming a luminescent layer (luminescent material). The method for manufacturing an electro-optical panel described in Embodiment 1 is used when the second composition (functional liquid) is discharged. Conventional material that is insoluble in the hole injection/transportation layers 717a is preferably used as the solvent (nonpolar solvent) for the second composition, and the use of such a nonpolar solvent in the second composition of the luminescent layers 717b makes it possible to form the luminescent layers 717b without re-dissolving the hole injection/transportation layers 717a.

The luminescent layers 717b are then configured such that light is emitted by the recombination of the holes injected from the hole injection/transportation layers 717a and the electrons injected from a negative electrode 704 in the luminescent layers. The negative electrode 704 is formed to cover the entire surface of the light-emitting element 703, and is paired with the pixel electrodes 713 to fill the role of supplying an electric current to the function layers 717. A sealing member (not shown) is disposed at the top of the negative electrode 704.

Figure 17:
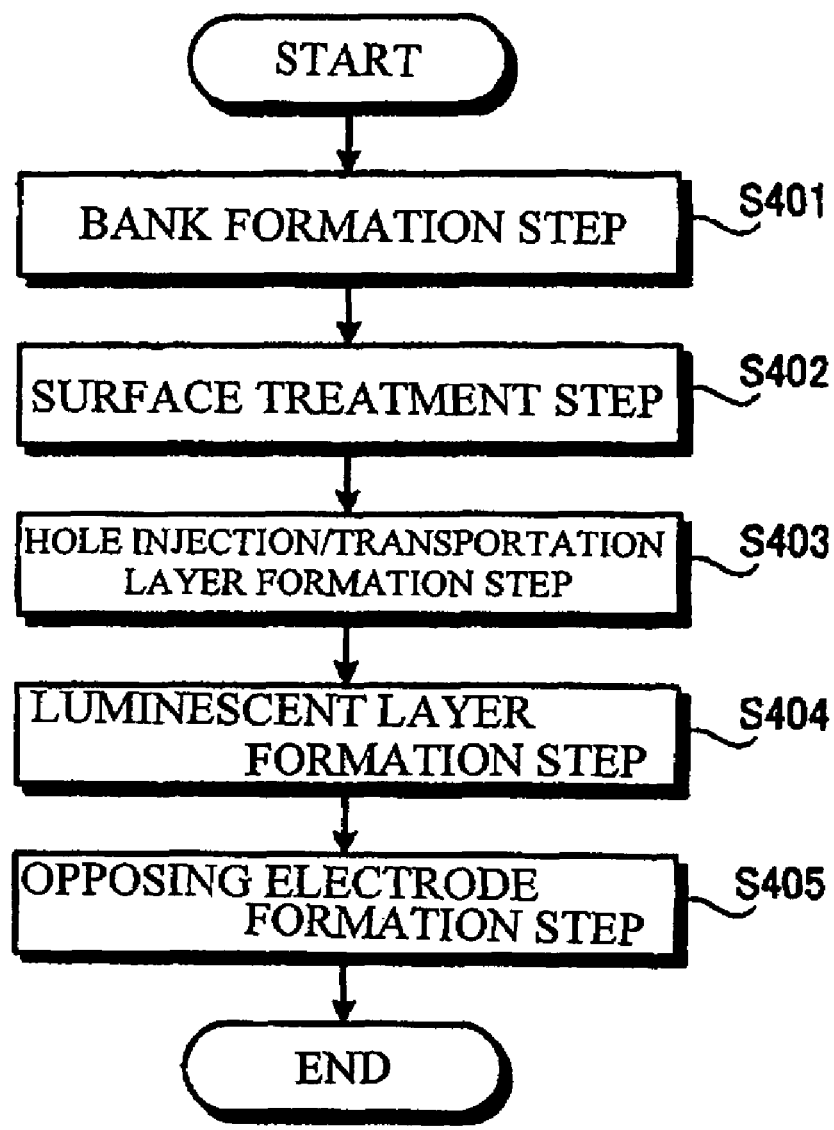
FIG. 17 is a flow chart showing a process of manufacturing an organic EL display device.

FIG. 17 is a flow chart showing the process of manufacturing an organic EL display device. FIGS. 18 through 25 are explanatory diagrams showing the process of manufacturing an organic EL display device. The process of manufacturing the above-mentioned organic display device 700 will now be described with reference to FIGS. 17 through 25. The organic display device 700 is manufactured via a bank part formation step (step S401), a surface treatment step (step S402), a hole injection/transportation layer formation step (step S403), a luminescent layer formation step (step S404), and a counter electrode formation step (step S405), as shown in FIG. 17. The manufacturing process is not limited to the given example, and steps may be excluded or added as necessary.

Figure 18:
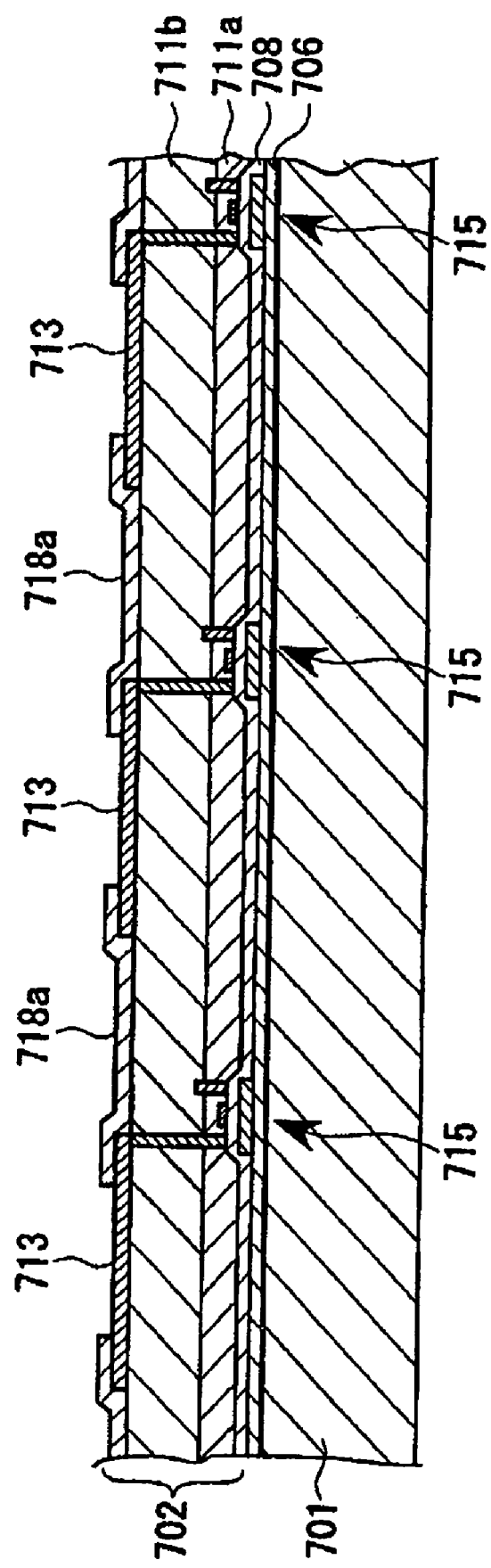
FIG. 18 is an explanatory diagram showing the process of manufacturing the organic EL display device.
Figure 19:
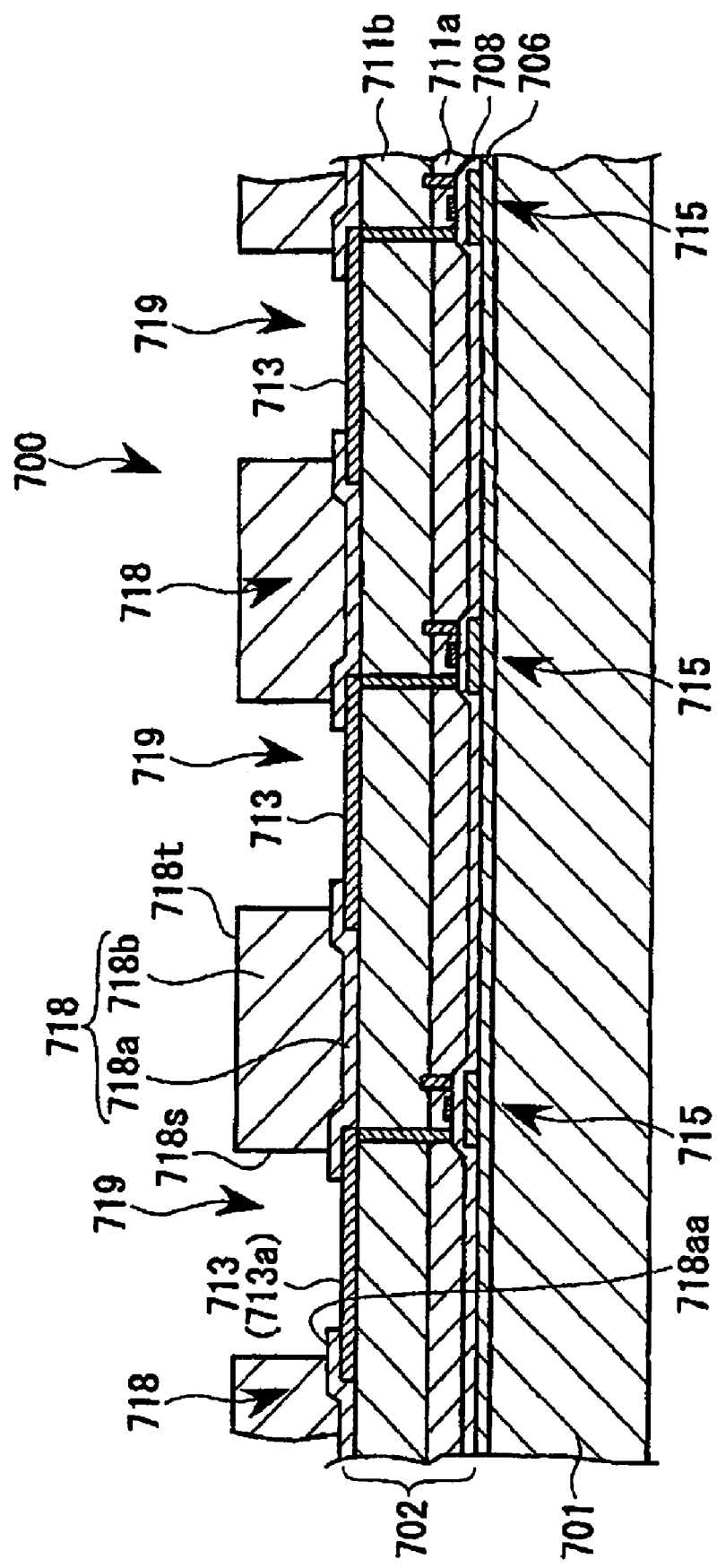
FIG. 19 is an explanatory diagram showing the process of manufacturing the organic EL display device.

First, in the bank part formation step (step S401), inorganic bank layers 718a are formed on the second layer insulation film 711b, as shown in FIG. 18. These inorganic bank layers 718a are obtained by forming an inorganic film at a formation location and then patterning the inorganic film by photolithography or the like. At this point, part of the inorganic bank layer 718a is formed to overlap the edge of the pixel electrode 713. Once the inorganic bank layers 718a are formed, the organic bank layers 718b are formed on the inorganic bank layers 718a as shown in FIG. 19. These organic bank layers 718b are also patterned by photolithography techniques or the like in the same manner as the inorganic bank layers 718a. The bank parts 718 are formed in this manner.

In addition, the openings 719 that open upward in relation to the pixel electrodes 713 are formed during this process between the bank parts 718. These openings 719 define the pixel areas.

In the surface treatment step (S22), lyophilic treatment and liquid repellant treatment are performed. The areas subjected to lyophilic treatment are the first laminated parts 718a of the inorganic bank layers 718a and the electrode surfaces 713a of the pixel electrodes 713, and these areas are subjected to a lyophilic surface treatment by a plasma treatment in which oxygen, for example, is used as a treatment gas. This plasma treatment also acts to clean or otherwise process the ITO that constitutes the pixel electrodes 713. Also, the liquid repellant treatment is performed on the wall surfaces 718s of the organic bank layers 718b and the upper surfaces 718t of the organic bank layers 718b, and the surfaces are subjected to fluoride treatment (liquid repellant treatment) by a plasma treatment in which tetrafluoromethane, for example, is used as a treatment gas. Performing this surface treatment step makes it possible for the functional liquid droplets to land more reliably on the pixel areas when the function layers 717 are formed using the functional droplet discharge head 51, and also makes it possible to prevent the functional liquid droplets that have landed on the pixel areas from overflowing in the openings 719.

Figure 20:
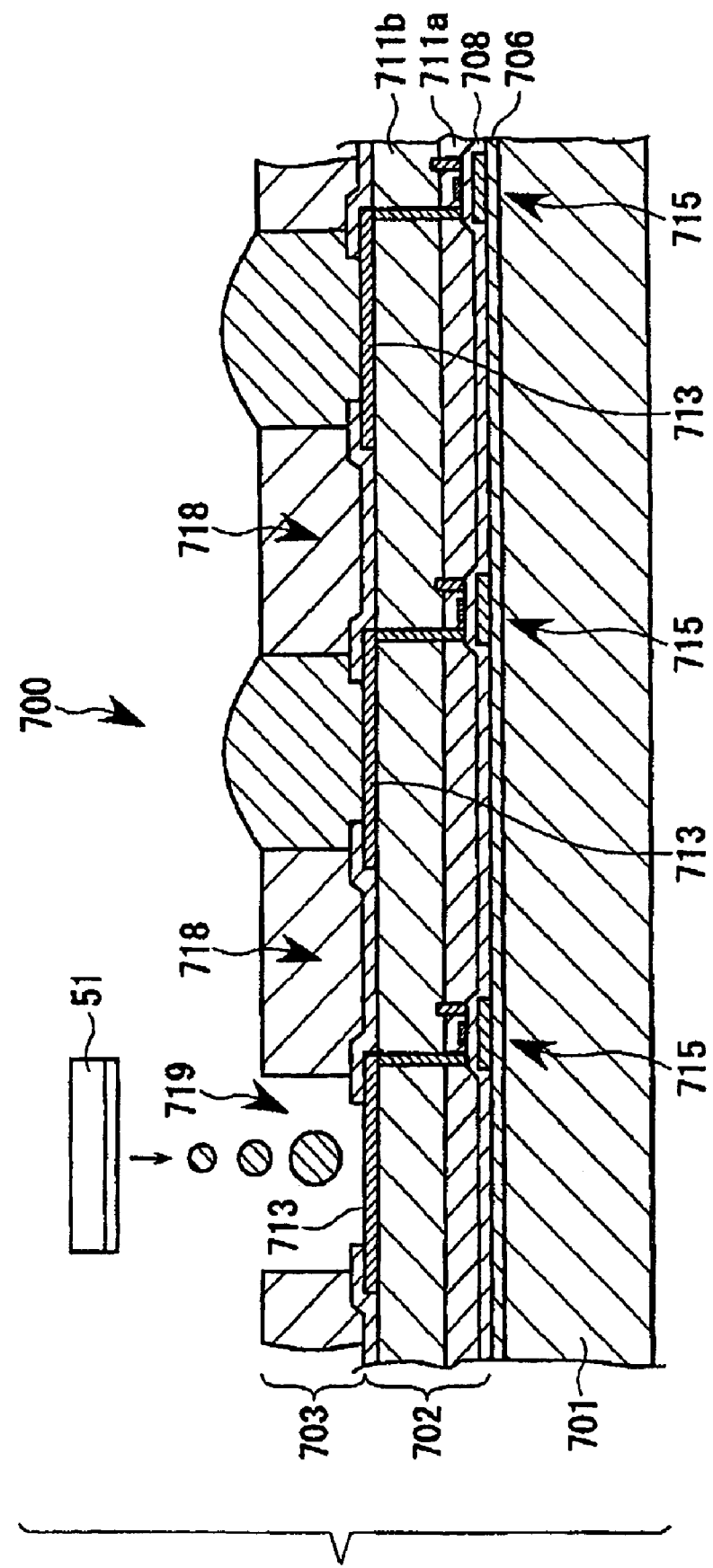
FIG. 20 is an explanatory diagram showing the process of manufacturing the organic EL display device.
Figure 21:
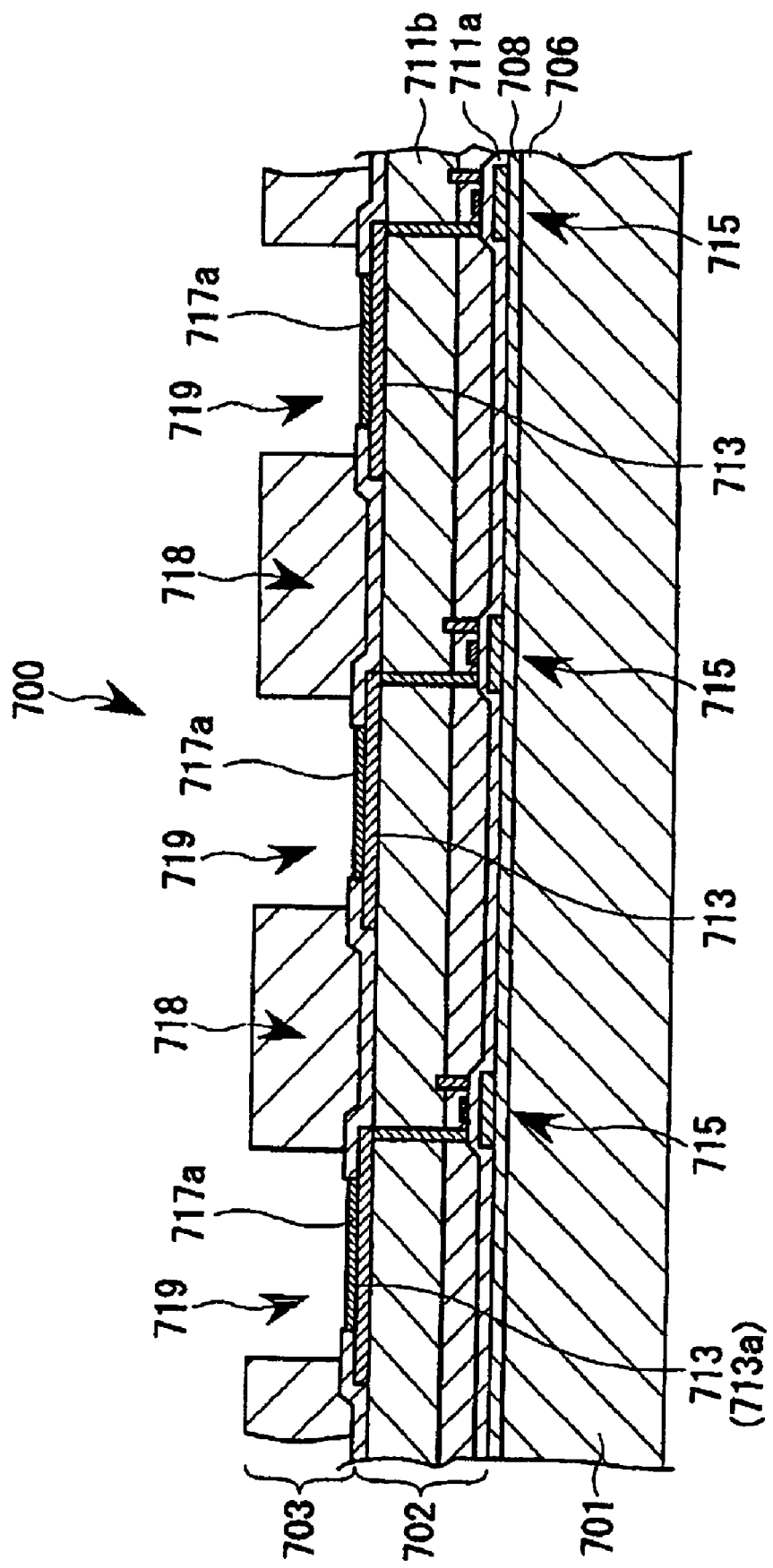
FIG. 21 is an explanatory diagram showing the process of manufacturing the organic EL display device.

A display device substrate 700A is thus obtained as a result of the steps described above. This display device substrate 700A is mounted on the substrate stage 60 of the droplet discharge device 50 relating to Embodiment 1 shown in FIG. 3, and the following hole injection/transportation layer formation step (step S403) and luminescent layer formation step (step S404) are performed by using the method for manufacturing an electro-optical panel described in Embodiment 1. In the hole injection/transportation layer formation step (step S403), the first composition that contains the hole injection/transportation layer formation material is discharged from the functional droplet discharge head 51 into the openings 719, which constitute pixel areas, as shown in FIG. 20. Then, drying treatment and heating treatment are performed, the polar solvent contained in the first composition is evaporated, and hole injection/transportation layers 717a are formed on the pixel electrodes (electrode surfaces 713a) 713, as shown in FIG. 21.

The luminescent layer formation step (step S404) will now be described. In the luminescent layer formation step, a nonpolar solvent that does not dissolve the hole injection/transportation layers 717a is used as the solvent for the second composition used in luminescent layer formation, in order to prevent the hole injection/transportation layers 717a from redissolving, as described above. However, since the hole injection/transportation layers 717a have low affinity for nonpolar solvents, it is possible that the hole injection/transportation layers 717a and the luminescent layers 717b will fail to bond to each other, or that the luminescent layers 717b will fail to be uniformly coated, even if the second composition that contains the nonpolar solvent is discharged onto the hole injection/transportation layers 717a.

In view of this, a surface treatment (surface reforming treatment) is preferably performed prior to the luminescent layer formation in order to increase the affinity of the surface of the hole injection/transportation layers 717a for the nonpolar solvent and the luminescent layer formation material. The surface treatment is performed by coating the hole injection/transportation layers 717a with a surface reforming material, which is a solvent identical or similar to the nonpolar solvent of the second composition used in luminescent layer formation, and drying the resulting coating. Applying such a treatment allows the surfaces of the hole injection/transportation layers 717a to dissolve easily in the nonpolar solvent and makes it possible to coat uniformly the hole injection/transportation layers 717a with the second composition that contains the luminescent layer formation material by using the method for manufacturing an electro-optical panel described in Embodiment 1 in the subsequent steps.

Figure 22:
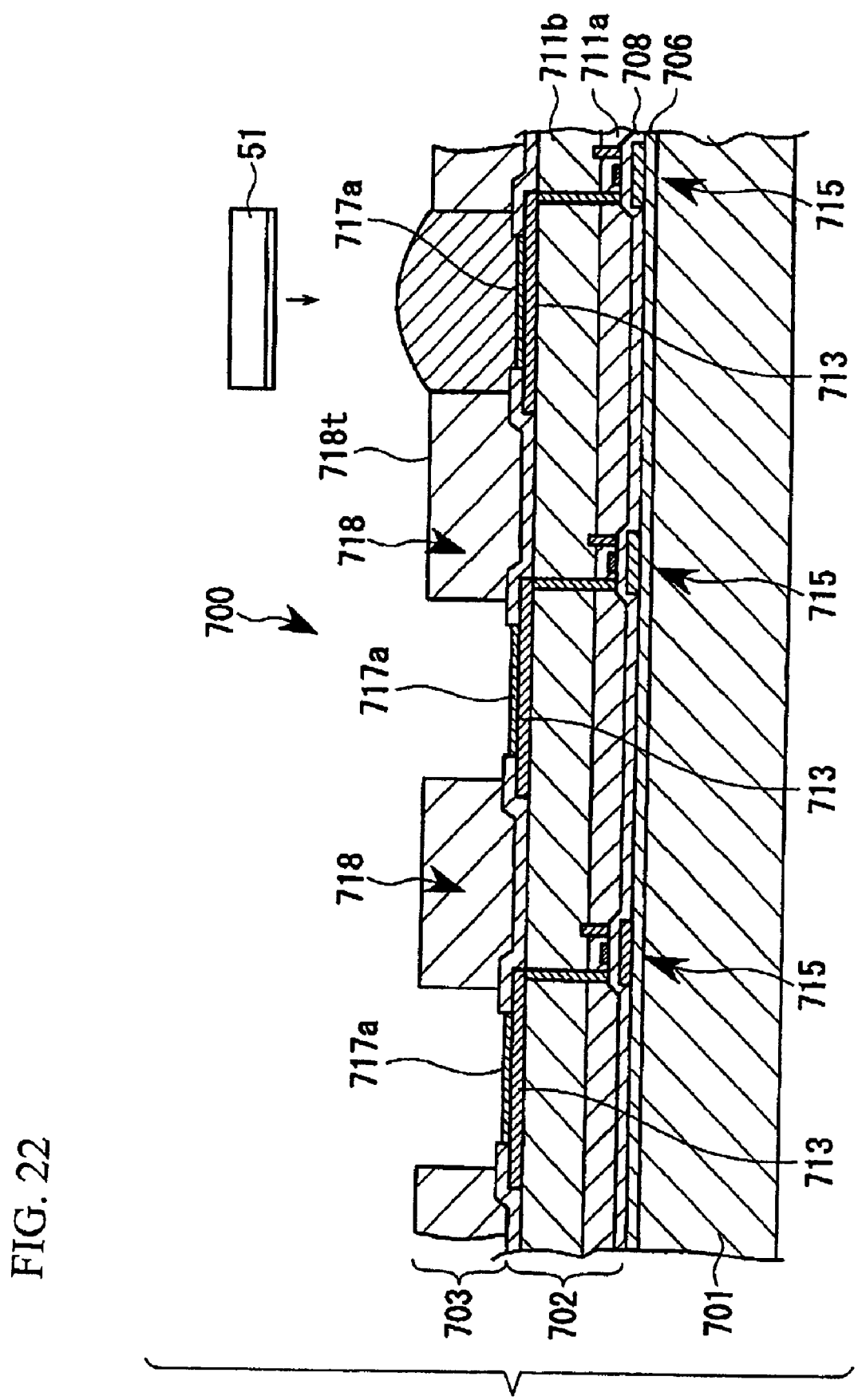
FIG. 22 is an explanatory diagram showing the process of manufacturing the organic EL display device.

Next, the second composition with the luminescent layer formation material that corresponds to any of a variety of colors (blue (B) in the example in FIG. 22) is applied in a specific amount in the form of functional liquid droplets onto the pixel area (openings 719), as shown in FIG. 22. The second composition applied to the pixel area expands onto the hole injection/transportation layers 717a and fills in the openings 719. If the second composition happens to miss the pixel area and strike the upper surface 718t of the bank parts 718, the second composition will easily flow into the openings 719 because the upper surface 718t has been subjected to liquid repellent treatment as described above.

Figure 23:
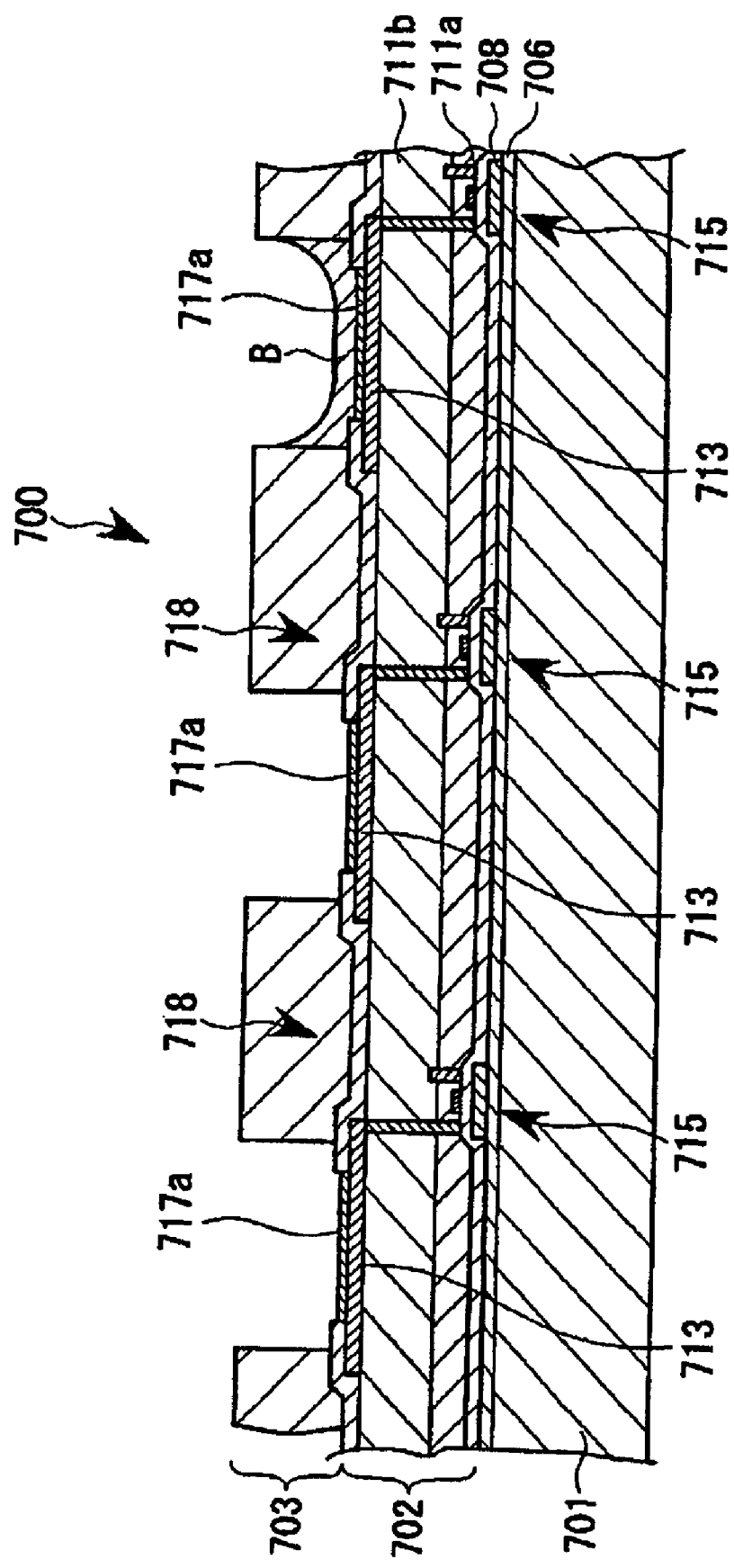
FIG. 23 is an explanatory diagram showing the process of manufacturing the organic EL display device.
Figure 24:
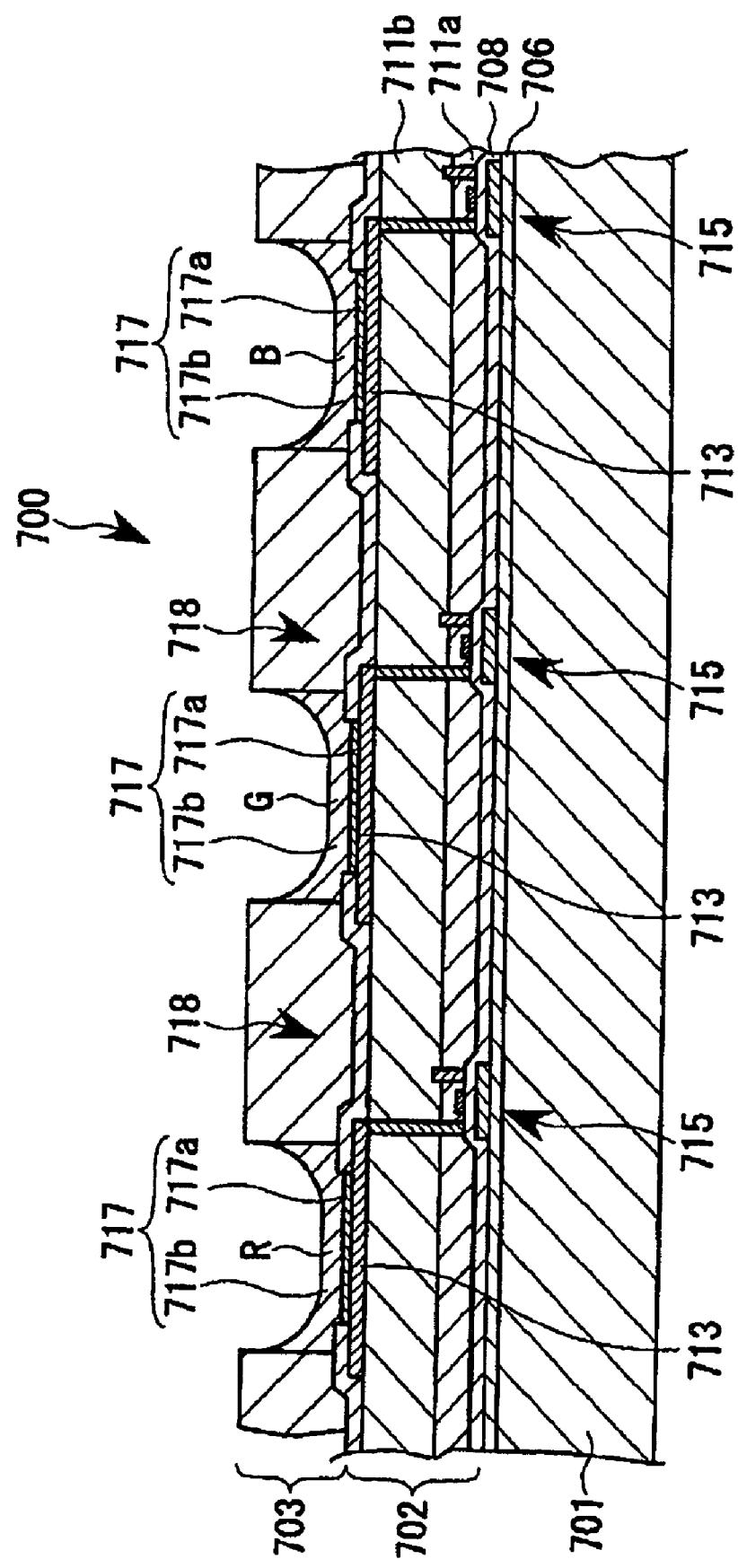
FIG. 24 is an explanatory diagram showing the process of manufacturing the organic EL display device.

The discharged second composition is then subjected to drying treatment by performing a drying step or the like, the nonpolar solvent contained in the second composition is evaporated, and the luminescent layers 717b are formed on the hole injection/transportation layers 717a as shown in FIG. 23. In this case, luminescent layers 717b corresponding to the color blue (B) are formed. Similarly, the functional droplet discharge head 51 is used to perform sequentially the same steps as in the case of luminescent layers 717b, which correspond to the color blue (B) in the above-described manner, by using the method for manufacturing an electro-optical panel described in Embodiment 1, and luminescent layers 717b corresponding to other colors (red (R) and green (G)) are also formed, as shown in FIG. 24. The sequence of forming the luminescent layers 717b is not limited to the sequence herein exemplified, and the layers may be formed in any order. For example, the order of formation can be determined according to the luminescent layer formation material. The alignment pattern of the three colors red, green, and blue can be stripes, a mosaic, a delta, or other such alignment.

Figure 25:
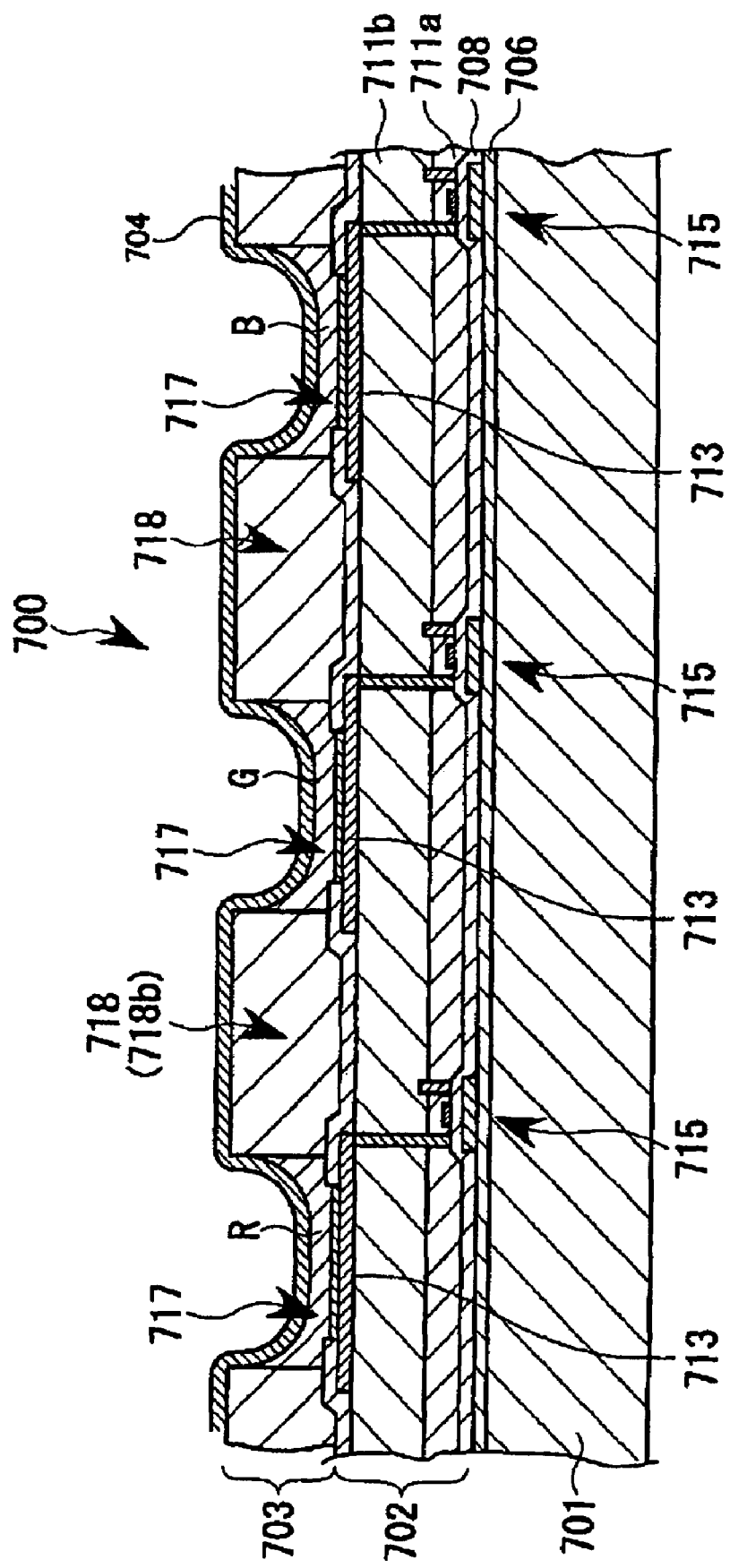
FIG. 25 is an explanatory diagram showing the process of manufacturing the organic EL display device.

The function layers 717, or, specifically, the hole injection/transportation layers 717a and luminescent layers 717b are formed on the pixel electrodes 713 as described above. Next, the counter electrode formation step (step S405) is performed. In the counter electrode formation step (step S405), a negative electrode 704 (counter electrode) is formed on the entire surfaces of the luminescent layers 717b and the organic bank layers 718b by vapor deposition, sputtering, CVD, or the like, as shown in FIG. 25. In the present embodiment, the negative electrode 704 is configured by the lamination of a calcium layer and an aluminum layer, for example. The top part of the negative electrode 704 is provided as necessary with an Al film and an Ag film as electrodes, and with a protective layer of $SiO_2$, SiN, or the like to prevent oxidation thereof. After the negative electrode 704 is thus formed, an organic display device 700 is obtained by performing a wiring treatment, a sealing treatment wherein the top part of the negative electrode 704 is sealed with a seal member, or another such treatment.

Figure 26:
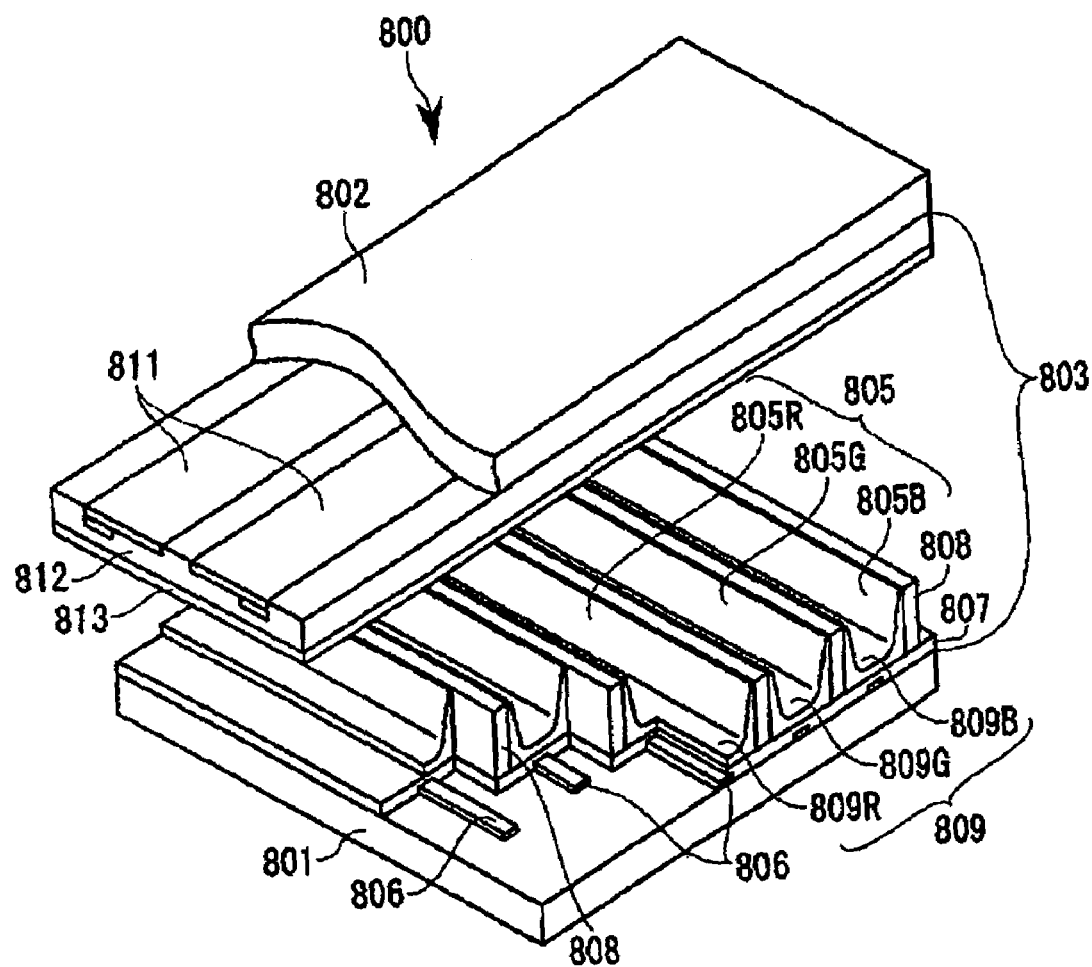
FIG. 26 is a partial exploded perspective view of a plasma display device.

FIG. 26 is a partial exploded perspective view of a plasma display device. This diagram shows the display device (hereinafter the PDP display device) 800 partially cut away. The PDP display device 800 is essentially configured by including a first substrate 801 and a second substrate 802 disposed facing each other, and a discharge display part 803 formed between these two substrates. The discharge display part 803 is configured from a plurality of discharge chambers 805. Within this plurality of discharge chambers 805, three discharge chambers 805 made of a red discharge chamber 805R, a green discharge chamber 805G, and a blue discharge chamber 805B constitute a group and are aligned to form one picture element.

Address electrodes 806 are formed in a striped configuration at specific intervals on the upper surface of the first substrate 801, and a dielectric layer 807 is formed to cover the address electrodes 806 and the upper surface of the first substrate 801. Partitioning walls 808 located between the address electrodes 806 are formed on the dielectric layer 807 to extend along the address electrodes 806. The partitioning walls 808 include those that are shown in the diagram and extend on both sides in the width direction of the address electrodes 806, and those that are not shown in the diagram and extend in the direction perpendicular to the address electrodes 806. The areas partitioned off by the partitioning walls 808 form the discharge chambers 805.

A fluorescent substance 809 is disposed in the discharge chambers 805. The fluorescent substance 809 emits fluorescent light in colors of red (R), green (G), and blue (B), so a red fluorescent substance 809R is disposed in the lower section of the red discharge chamber 805R, a green fluorescent substance 809G is disposed in the lower section of the green discharge chamber 805G, and a blue fluorescent substance 809B is disposed in the lower section of the blue discharge chamber 805B.

A plurality of display electrodes 811 is formed in a striped configuration at specific intervals in the direction perpendicular to the above-mentioned address electrodes 806 on the surface of the second substrate 802 at the bottom of the diagram. A dielectric layer 812 and a protective layer 813 composed of MgO or the like are formed to cover these electrodes. The first substrate 801 and the second substrate 802 are affixed so that the address electrodes 806 and the display electrodes 811 face each other in a mutually orthogonal arrangement. The above-mentioned address electrodes 806 and the display electrodes 811 are connected to an AC power source (not shown). The fluorescent substance 809 is excited and caused to emit light in the discharge display part 803 by the energizing of the electrodes 806 and 811, and images can be displayed in color.

In the present embodiment, the above-mentioned address electrodes 806, display electrodes 811, and fluorescent substance 809 can be formed using the method for manufacturing an electro-optical panel described in Embodiment 1. The step for molding the address electrodes 806 in the first substrate 801 is exemplified below. In this case, the following step is performed in a state in which the first substrate 801 is mounted on the stage 60 of the droplet discharge device 50. First, a liquid material (functional liquid) containing the material for forming conductive film wiring is sprayed as functional liquid droplets on the address electrode formation area using the method for manufacturing an electro-optical panel described in Embodiment 1, by the functional droplet discharge head 51. This liquid material is made of metallic or other such conductive fine particles dispersed in a dispersion medium as a material for forming conductive film wiring. Metallic fine particles or a conductive polymer that contains gold, silver, copper, palladium, nickel, or the like is used for the conductive fine particles.

When the filling of all the address electrode formation areas with the liquid material is complete, the discharged liquid material is subjected to a drying treatment, and the dispersion medium contained in the liquid material is evaporated to form the address electrodes 806. The formation of the address electrodes 806 was exemplified above, but the above-mentioned display electrodes 811 and fluorescent substance 809 can also be formed by the steps described above. When the display electrodes 811 are formed, the liquid material (functional liquid) containing the material for forming the conductive film wiring is sprayed over the display electrode formation areas as functional liquid droplets by the method for manufacturing an electro-optical panel described in Embodiment 1, similar to the case of the address electrodes 806. Also, when the fluorescent substance 809 is formed, a liquid material (functional liquid) that contains a fluorescent material for each color (R, G, B) is discharged as droplets from the functional droplet discharge head 51. The liquid material is then sprayed into the discharge chambers 805 of the corresponding colors using the method for manufacturing an electro-optical panel described in Embodiment 1.

Figure 27:
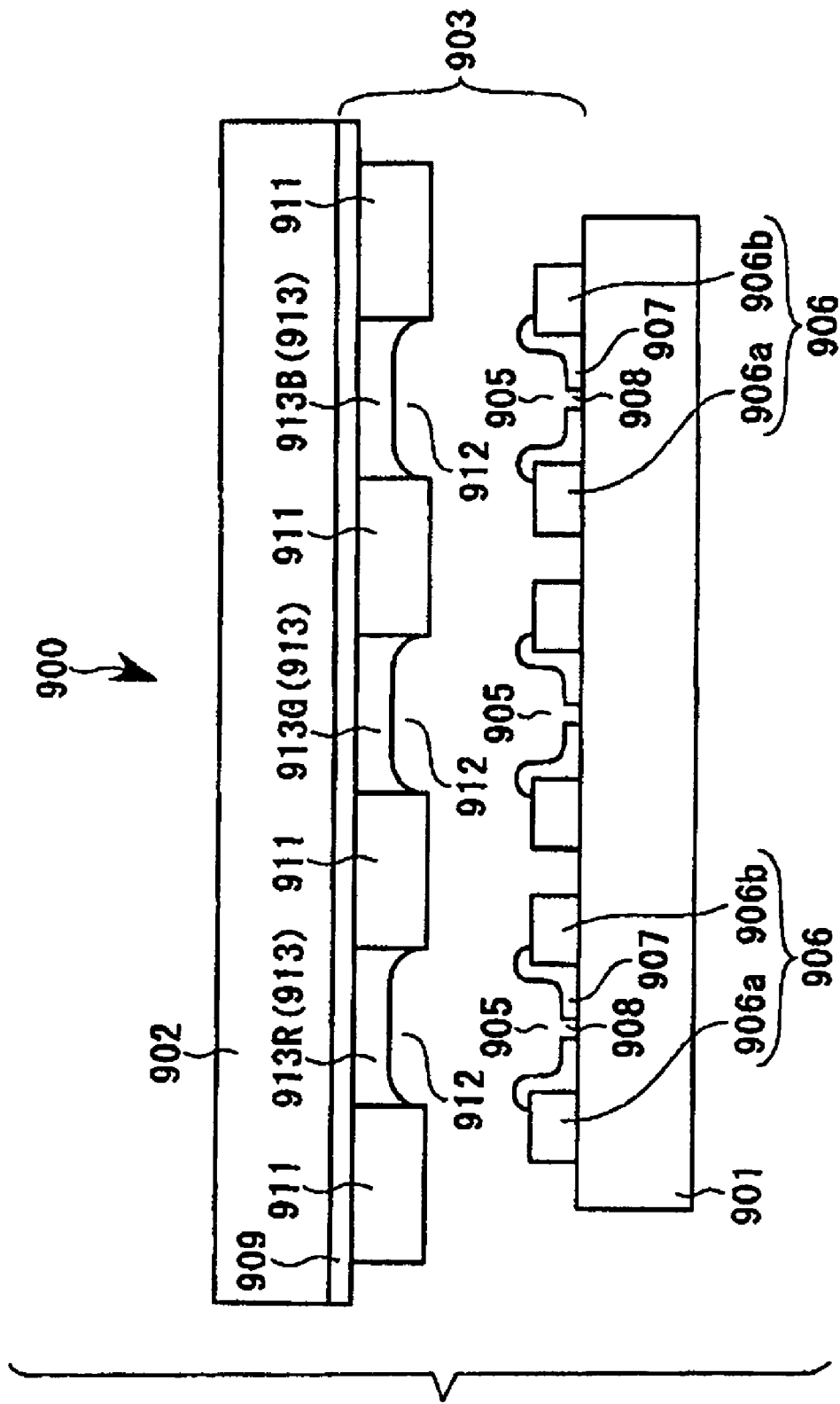
FIG. 27 is a partial cross-sectional view of an electron emission display device.

Next, FIG. 27 is a partial cross-sectional view of an electron emission display device. This diagram shows the electron emission display device (also referred to as FED device or SED device: hereinafter referred to as FED display device 900) 900 partially cut away. This FED display device 900 is essentially configured with a first substrate 901 and a second substrate 902 disposed facing each other, and a field emission display part 903 formed between these two substrates. The field emission display part 903 is configured from a plurality of electron emission parts 905 disposed in a matrix configuration.

A first element electrode 906a and a second element electrode 906b, which constitute a cathode electrode 906, are formed to be mutually orthogonal on the upper surface of the first substrate 901. A conductive film 907 with a gap 908 is formed in the area partitioned off by the first element electrode 906a and second element electrode 906b. Specifically, a plurality of electron emission parts 905 is configured from the first element electrode 906a, the second element electrode 906b, and the conductive film 907. The conductive film 907 is composed, for example, of palladium oxide (PdO) or the like, and the gap 908 is formed by foaming or the like after the conductive film 907 is molded.

An anode electrode 909 facing the cathode electrode 906 is formed on the lower surface of the second substrate 902. A lattice-shaped bank part 911 is formed on the lower surface of the anode electrode 909, and a fluorescent substance 913 that corresponds to the electron emission parts 905 is disposed in downward-facing openings 912 enclosed by the bank part 911. The fluorescent substance 913 emits fluorescent light of the colors red (R), green (G), and blue (B), and a red fluorescent substance 913R, a green fluorescent substance 913G, and a blue fluorescent substance 913B are disposed in the openings 912 in the specific pattern described above.

The first substrate 901 and the second substrate 902 configured in this manner are affixed to allow a small gap to remain. In the display device 900, electrons emitted from the first element electrode 906a or the second element electrode 906b, which are negative electrodes, pass through the conductive film (gap 908) 907 to strike the fluorescent substance 913 formed on the anode electrode 909, which is a positive electrode, such that the substance is excited and caused to emit light to allow colored images to be displayed.

In this case, the first element electrode 906a, second element electrode 906b, conductive film 907, and anode electrode 909 can be formed using the droplet discharge device 50 relating to Embodiment 1, and also the fluorescent substances 913R, 913G, and 913B of each color can be formed using the method for manufacturing an electro-optical panel described in Embodiment 1.

Figures 1, 28:
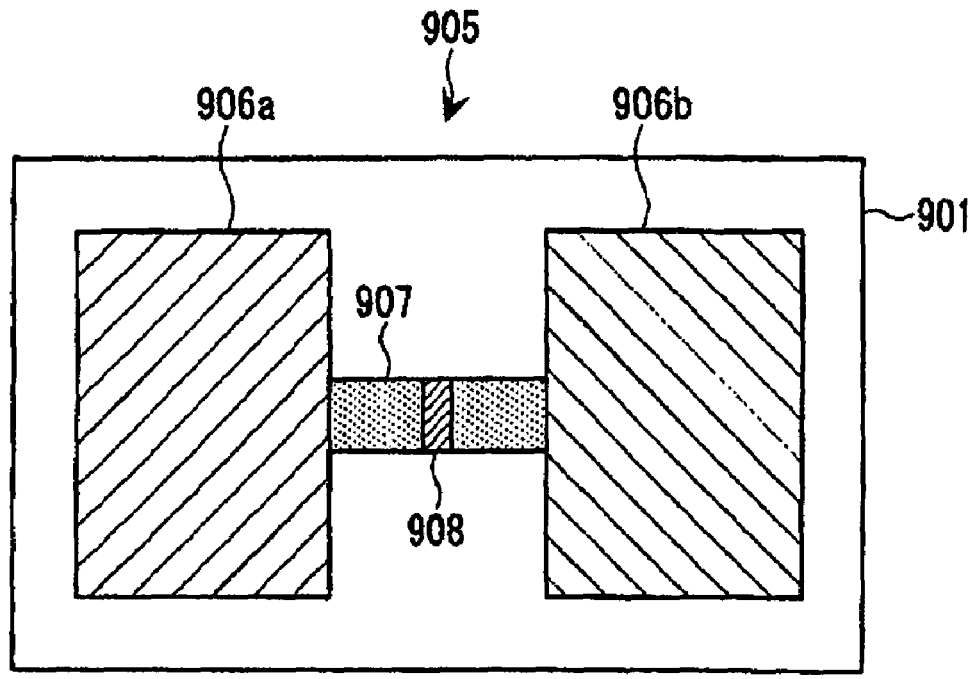
Figures 2, 28:
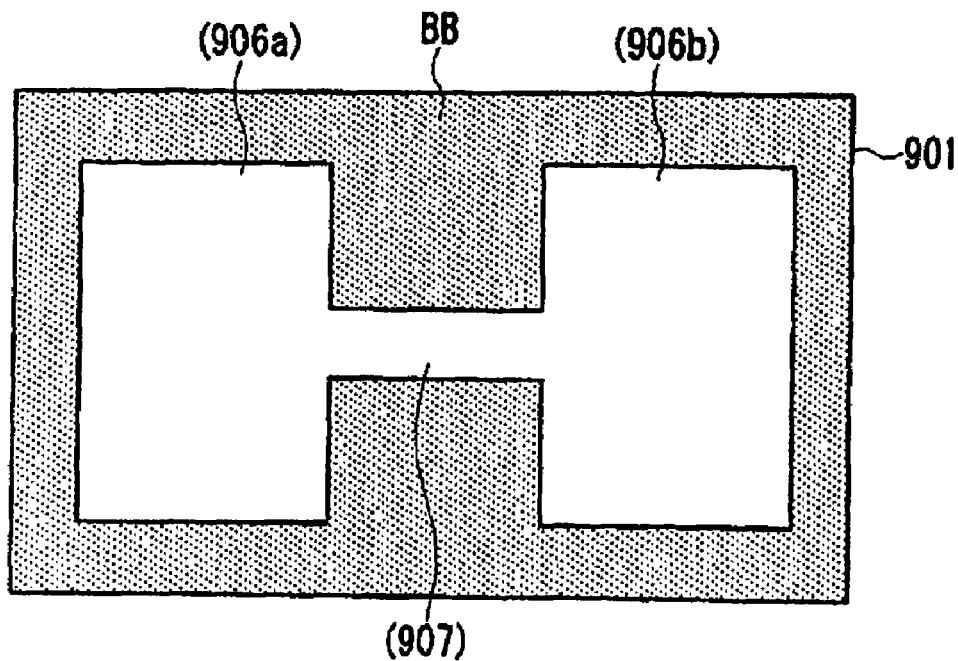

FIG. 28-1 is a plan view showing the configuration of a first element electrode, a second element electrode, and a conductive film.

FIG. 28-2 is a plan view showing the process of forming a first element electrode, a second element electrode, and a conductive film. The first element electrode 906a, second element electrode 906b, and conductive film 907 have the planar shape shown in FIG. 28-1, and when a film is formed thereon, the sections provided in advance with the first element electrode 906a, second element electrode 906b, and conductive film 907 are allowed to remain, and a bank part BB is formed (photolithography) as shown in FIG. 28-2. Next, the first element electrode 906a and the second element electrode 906b are formed (by the method for manufacturing an electro-optical panel described in Embodiment 1) in the groove section formed by the bank part BB, the solvent is dried to form the film, and the conductive film 907 is then formed (by the method for manufacturing an electro-optical panel described in Embodiment 1). After the conductive film 907 is formed, the bank part BB is removed (ashing), and the process proceeds to the above-mentioned foaming treatment. It is then preferable to perform lyophilic treatment on the first substrate 901 and the second substrate 902, and to perform liquid repellant treatment on the bank parts 911 and BB, similar to when the above-mentioned organic EL device is used.

Other possible examples of electrooptical devices include devices for metal wiring formation, lens formation, resist formation, light diffuser formation, and the like. In Embodiment 4 described above, the method for manufacturing an electro-optical panel described in Embodiment 1 is used to manufacture various electro-optical apparatuses (devices). Specifically, the functional liquid is discharged with the intervals of droplets of the functional liquid in the direction of nozzle alignment greater than the intervals of droplets of the functional liquid in a direction perpendicular to the direction of nozzle alignment; therefore, it is possible to suppress reduction in the rate at which the functional film fabrication material used to configure the electro-optical apparatus is applied. It is thereby possible to manufacture efficiently various electrooptical devices.

OBJECT OF APPLICATION

In addition to portable phones, examples of electronic devices to which the electro-optical panel relating to the present invention can be applied include portable information devices known as PDAs (personal digital assistants), portable personal computers, personal computers, digital still cameras, in-vehicle monitors, digital video cameras, liquid crystal televisions, tape recorders with viewfinders and direct-view tape recorders with monitors, car navigation devices, pagers, electronic notebooks, calculators, word processors, workstations, video telephones, POS terminals, and other devices that use electro-optical panels as electro-optical devices. Therefore, it is apparent that the present invention can also be applied to the electrically connected structures in these electronic devices.

Also, the electro-optical panel may be a permeable or reflective electro-optical panel, and may use an illuminating device (not shown) as a backlight. The same applies to an active-matrix color electro-optical panel. For example, examples of passive-matrix electro-optical panels were given in the embodiments described above, but an active-matrix electro-optical panel (for example, an electro-optical panel containing a TFT (thin film transistor) or TFD (thin film diode) as a switching element) can similarly be used in the electro-optical device of the present invention. The present invention can not only be adapted to a liquid crystal display device as such an electro-optical panel, but can also be similarly used in various electro-optical devices in which the display state can be controlled for each of a plurality of pixels, such as an organic electroluminescence device, an inorganic electroluminescence device, a plasma display device, an electrophoretic display device, a field emission display device, an LED (light-emitting diode) display device, or the like. Furthermore, the present invention can also be applied to an electro-optical panel wherein a color filter substrate is disposed on the front surface of a light-emitting element formed in a matrix configuration.

The terms "front," "back," "up," "down," "perpendicular," "horizontal," "diagonal," and other direction-related terms used above indicate the directions in the diagrams used herein. Therefore, the direction-related terms used to describe the present invention should be interpreted in relative terms as applied to the diagrams used.

"Substantially," "essentially," "about," and other approximation-indicating terms used above represent a reasonable amount of deviation that does not bring about a considerable change as a result. Terms that represent these approximations should be interpreted to include an error of about ±5% at least, as long as there is no considerable change due to the deviation.

The entire disclosures in Japanese Patent Application Nos. 2003-068331 and 2004-040068 are incorporated in this specification by reference.

The embodiments described above constitute some of the possible embodiments of the present invention, and it is apparent to those skilled in the art that it is possible to add modifications to the above-described embodiments by using the above-described disclosure without exceeding the range of the present invention as defined in the claims. The above-described embodiments furthermore do not limit the range of the present invention, which is defined by the accompanying claims or equivalents thereof, and are only designed to provide a description of the present invention.

What is claimed is:

1. A functional film fabrication method for fabricating a functional film on a base having a flat surface, comprising:
   installing the base so that the flat surface is on top, and a droplet discharge head with a plurality of nozzles aligned in a first direction is placed above the flat surface; and
   discharging droplets of a functional liquid from the nozzles onto a predetermined discharge area in the base to continuously form a functional film within the predetermined discharge area,
   the discharging of the droplets including discharging the droplets so that an interval between adjacent droplets in the first direction within the predetermined discharge area is greater than an interval between adjacent droplets in a second direction perpendicular to the first direction within the predetermined discharge area.

2. The functional film fabrication method according to claim 1, wherein
   the functional liquid is a protective film material for a color filter.

3. The functional film fabrication method according to claim 2, further comprising
   forming a color filter on the flat surface of the base prior to the discharging of the droplets of the functional liquid, and
   drying the droplets of the functional liqiuid discharged onto the substrate.

4. The functional film fabrication method according to claim 3, further comprising
   modifying a surface of the color filter to improve the wettability of the surface of the color filter after the color filter is formed on the substrate.

5. The functional film fabrication method according to claim 1, further comprising
   fabricating the functional film on the flat surface by repeating the discharging of the droplets of the functional liquid from the nozzles onto the predetermined discharge area of the base as the nozzles are moved in the first direction and in the second direction.

6. The functional film fabrication method according to claim 5, wherein
   the fabricating of the functional film includes applying the functional liquid on the predetermined discharge area formed in the entire flat surface of the base.

7. The functional film fabrication method according to claim 5, wherein
   the fabricating of the functional film includes controlling the thickness of the functional film by varying the discharged amount of the droplets and/or the second direction movement distance.

8. The functional film fabrication method according to claim 5, wherein
   the functional liquid is a protective film material for a color filter.

9. The functional film fabrication method according to claim 5, further comprising
   forming a color filter on the flat surface of the base prior to the discharging of the droplets of the functional liquid, and
   drying the droplets of the functional liquid discharged onto the substrate.

10. The functional film fabrication method according to claim 9, further comprising
    modifying a surface of the color filter to improve the wettability of the surface of the color filter after the color filter is formed on the substrate.

11. The functional film fabrication method according to claim 10, further comprising
    installing an opposing substrate facing the functional film after the droplets of the functional liquid is dried, and
    injecting liquid crystal between the functional film and the opposing substrate.

12. The functional film fabrication method according to claim 11, further comprising affixing specific mounting components to the base to configure an electro-optical panel after the liquid crystal is injected between the functional film and the opposing substrate.

13. The functional film fabrication method according to claim 11, further comprising forming a light-emitting element in a matrix configuration on the opposing substrate after the liquid crystal is injected between the functional film and the opposing substrate.

* * * * *